(12) United States Patent
Shekel

(10) Patent No.: US 9,893,494 B2
(45) Date of Patent: *Feb. 13, 2018

(54) LASER SYSTEM INCLUDING OPTICAL AMPLIFICATION SUBSYSTEM PROVIDING AN AMPLIFIED LASER OUTPUT

(71) Applicant: CIVAN ADVANCED TECHNOLOGIES LTD., Jerusalem (IL)

(72) Inventor: Eyal Shekel, Moshav Beit Zayit (IL)

(73) Assignee: CIVAN ADVANCED TECHNOLOGIES LTD., Jerusalem (IL)

( * ) Notice: Subject to any disclaimer, the term of this patent is extended or adjusted under 35 U.S.C. 154(b) by 0 days.

This patent is subject to a terminal disclaimer.

(21) Appl. No.: 15/406,032

(22) Filed: Jan. 13, 2017

(65) Prior Publication Data

US 2017/0125980 A1 May 4, 2017

Related U.S. Application Data

(63) Continuation of application No. 13/701,045, filed as application No. PCT/IL2011/000418 on May 30, 2011, now Pat. No. 9,584,224.

(30) Foreign Application Priority Data

Jun. 2, 2010 (IL) .......................... 206143

(51) Int. Cl.
*H01S 5/50* (2006.01)
*H01S 5/00* (2006.01)
(Continued)

(52) U.S. Cl.
CPC .......... *H01S 5/5027* (2013.01); *G02B 27/106* (2013.01); *G02F 1/0121* (2013.01); *H01S 5/0085* (2013.01)

(58) Field of Classification Search
CPC .............. G02F 1/0123; G02B 26/0841; G02B 26/0833; H04B 10/50575
(Continued)

(56) References Cited

U.S. PATENT DOCUMENTS 3,590,248 A 6/1971 Chatterton
4,648,092 A 3/1987 Ewbank et al.
(Continued)

FOREIGN PATENT DOCUMENTS

EP 0636908 2/1995
EP 2577819 3/2016
(Continued)

OTHER PUBLICATIONS

Supplementry Europan Search Report dated Mar. 10, 2014 which issued during the prosecution of Applicant's European App No. 11 78 9345.
(Continued)

*Primary Examiner* — Bumsuk Won
*Assistant Examiner* — Tamara Y Washington
(74) *Attorney, Agent, or Firm* — Sughrue Mion, PLLC

(57) ABSTRACT

A laser system including a seed laser and an optical amplification subsystem, receiving an output of the seed laser and providing an amplified laser output, the optical amplification subsystem including a first plurality of amplifier assemblies, each of the first plurality of amplifier assemblies including a second plurality of optical amplifiers, and phase control circuitry including phase modulating functionality associated with each of the first plurality of amplifier assemblies.

20 Claims, 11 Drawing Sheets

(51) Int. Cl.
*G02F 1/01* (2006.01)
*G02B 27/10* (2006.01)

(58) Field of Classification Search
USPC ...... 359/333, 337.11–337.13, 342, 345, 346, 359/349; 372/38.01–38.09, 50.22, 372/29.023; 385/88, 89, 129, 130, 134; 398/182, 183, 188, 192, 195, 198, 140, 398/141, 162
See application file for complete search history.

(56) References Cited

U.S. PATENT DOCUMENTS

| | | | |
|---|---|---|---|
| 4,649,351 | A | 3/1987 | Veldkamp et al. |
| 4,757,268 | A | 7/1988 | Abrams et al. |
| 4,761,059 | A | 8/1988 | Yeh et al. |
| 4,794,345 | A | 12/1988 | Linford et al. |
| 4,833,683 | A | 5/1989 | Ury et al. |
| 4,860,279 | A | 8/1989 | Falk et al. |
| 4,979,804 | A | 12/1990 | Lisson et al. |
| 5,023,882 | A | 6/1991 | Paoli |
| 5,121,400 | A | 6/1992 | Verdiell et al. |
| 5,233,673 | A | 8/1993 | Vali et al. |
| 5,539,571 | A | 7/1996 | Welch et al. |
| 5,661,747 | A | 8/1997 | Hiiro |
| 5,664,032 | A * | 9/1997 | Bischel .................. G02F 1/011 385/10 |
| 5,694,408 | A | 12/1997 | Bott et al. |
| 5,737,459 | A | 4/1998 | Epworth et al. |
| 5,799,024 | A | 8/1998 | Bowers |
| 5,835,261 | A | 11/1998 | Tamanuki et al. |
| 5,896,219 | A | 4/1999 | Wandernoth |
| 5,946,130 | A * | 8/1999 | Rice ..................... G02B 6/4249 359/346 |
| 6,144,677 | A | 11/2000 | Komine et al. |
| 6,200,309 | B1 | 3/2001 | Rice et al. |
| 6,233,085 | B1 | 5/2001 | Johnson |
| 6,366,356 | B1 | 4/2002 | Brosnan et al. |
| 6,385,288 | B1 | 5/2002 | Kanematsu |
| 6,400,871 | B1 | 6/2002 | minden |
| 6,404,784 | B2 | 6/2002 | Komine |
| 6,480,327 | B1 | 11/2002 | Betin |
| 6,580,534 | B2 | 6/2003 | Madsen |
| 6,678,294 | B1 | 1/2004 | Komine et al. |
| 6,717,719 | B1 | 4/2004 | Moore |
| 6,813,069 | B2 | 11/2004 | Rice et al. |
| 6,882,781 | B2 | 4/2005 | Ionov |
| 7,027,475 | B1 | 4/2006 | Zediker et al. |
| 7,058,098 | B1 | 6/2006 | Shay |
| 7,088,743 | B2 | 8/2006 | Rice et al. |
| 7,187,492 | B1 | 3/2007 | Shay |
| 7,233,433 | B1 | 6/2007 | Shay |
| 7,239,777 | B1 | 7/2007 | Christensen et al. |
| 7,336,363 | B2 | 2/2008 | Rothenberg |
| 7,561,810 | B2 | 7/2009 | Noguchi et al. |
| 9,584,224 | B2 * | 2/2017 | Shekel .................. H01S 5/4012 |
| 2003/0095737 | A1 | 5/2003 | Welch et al. |
| 2004/0179841 | A1 | 9/2004 | Shahar |
| 2006/0239312 | A1 | 10/2006 | Kewitsch et al. |
| 2007/0248136 | A1 | 10/2007 | Leonardo et al. |
| 2009/0185811 | A1 | 7/2009 | Cho et al. |
| 2009/0225401 | A1 | 9/2009 | Chen et al. |
| 2013/0107343 | A1 | 5/2013 | Shekel |

FOREIGN PATENT DOCUMENTS

| | | |
|---|---|---|
| WO | 2003/032021 | 4/2003 |
| WO | 2008/045655 | 4/2008 |
| WO | 2010/046661 | 4/2010 |
| WO | 2011/151818 | 12/2011 |

OTHER PUBLICATIONS

"M2k-TA-0976-2000 Tapered Amplifier for MOPA Setups", (Jan. 1, 2012), XP055106326 Retrieved from the Internet: Mar. 7, 2014.

An Office Action dated Nov. 27, 2013 which issued during the prosecution of Applicant's European App No. 11789345.3.

An English Translation of an Office Action dated Nov. 10, 2013, which issued during the prosecution of Israel Patent Application No. 206143. (the relevant part only).

Jesse Anderegg et al.:"Coherently coupled high-power fiber arrays", Roceedings of SPIE, vol. 6102, Feb. 9, 2006 (Feb. 9, 2006), pp. 61020U-1 to 61020U-5, XP055088973, ISSN: 0277-768X, DOI: 10.1117/12.650138 discloses, cf. Fig. 1 and "Experiment", the subject-matter of claim 1.

K.H., No et al, 'One Dimension Scaling of 100 Ridge Waveguide Amplifiers'. *Photonics Technology Letters*. (1994) vol. 6, No. 9, pp. 1062-1066 (abstract only).

An International Search Report and a Written Opinion both dated Nov. 7, 2011, which issued during the prosecution of Applicant's PCT/IL2011/000418.

An International Preliminary Report on Patentability dated Dec. 4, 2012,, which issued during the prosecution of Applicant's PCT/IL2011/000418.

An Office Action dated Apr. 22, 2016, which issued during the prosecution of U.S. Appl. No. 13/701,045.

An Office Action dated Oct. 21, 2014, which issued during the prosecution of U.S. Appl. No. 13/701,045.

Notice of Allowance dated Oct. 21, 2016, which issued during the prosecution of U.S. Appl. No. 13/701,045.

An Office Action dated Sep. 29, 2015, which issued during the prosecution of U.S. Appl. No. 13/701,045.

An Office Action dated Jan. 23, 2015, which issued during the prosecution of U.S. Appl. No. 13/701,045.

An English Translation of an Office Action dated Mar. 13, 2016, which issued during the prosecution of Israel Patent Application No. 239349. (the relevant part only).

U.S. Appl. No. 13/701,045, filed Jan. 3, 2013, Published as 2013/0107343, issued as 9,584,224.

* cited by examiner

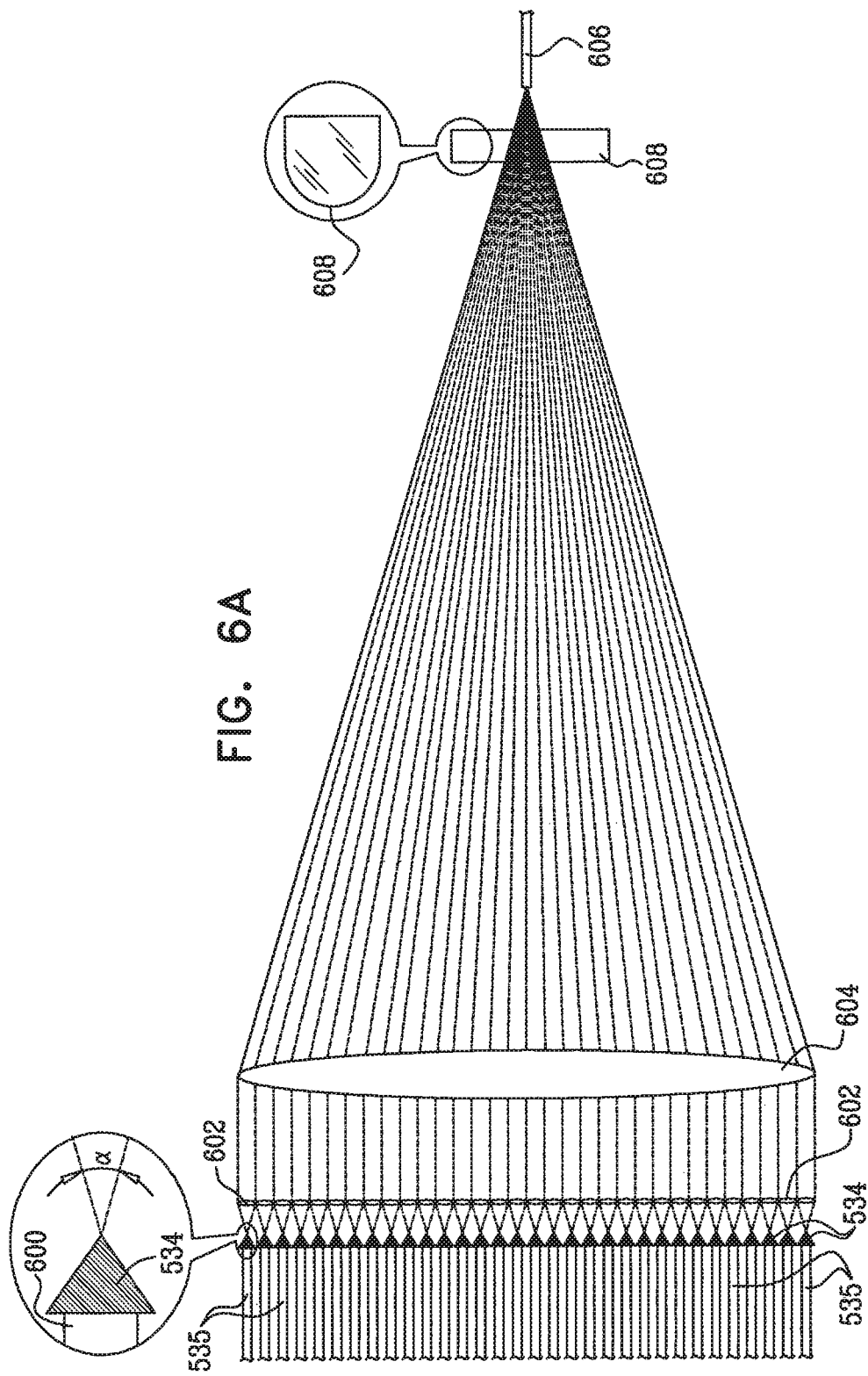

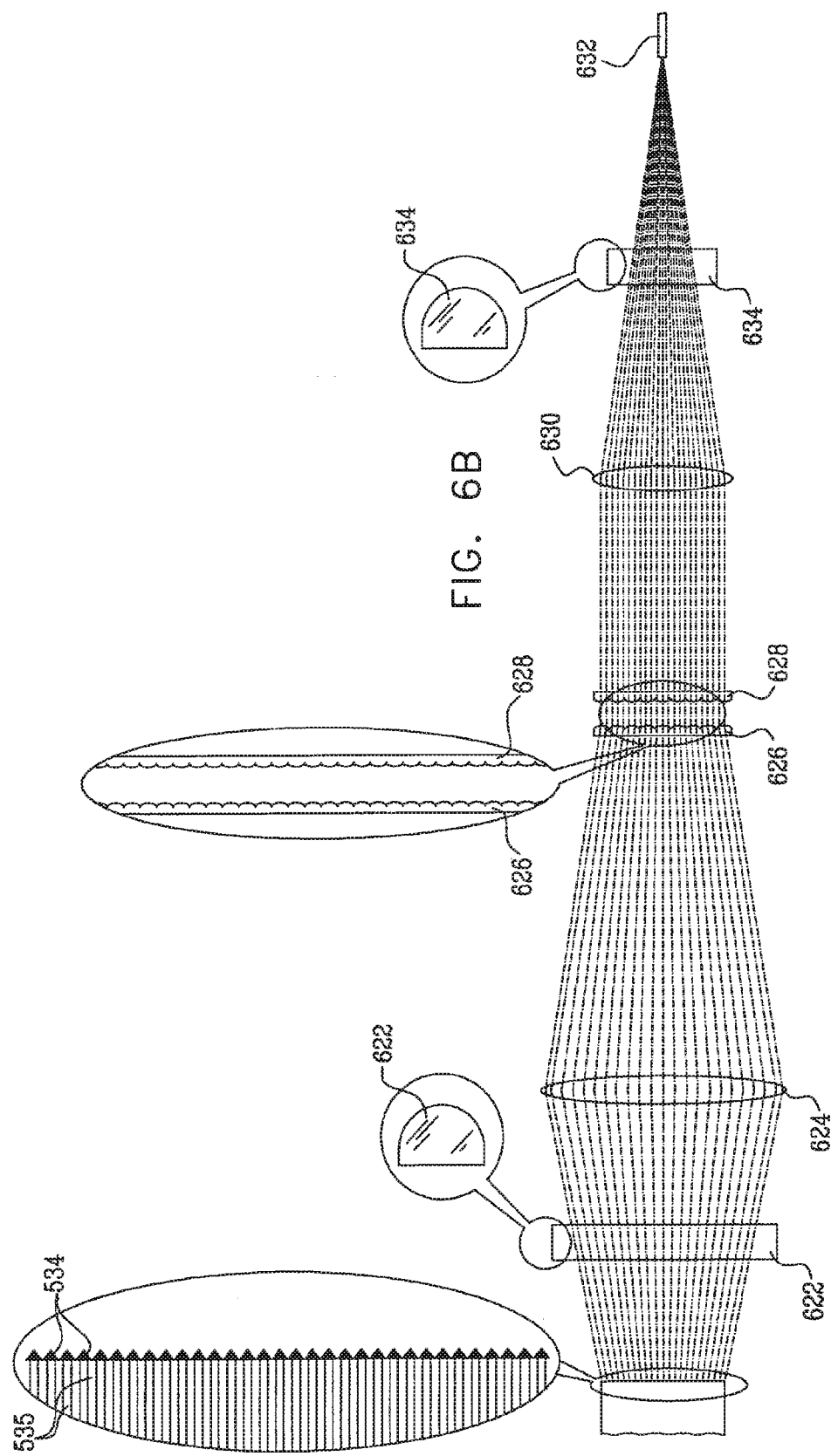

US 9,893,494 B2

LASER SYSTEM INCLUDING OPTICAL AMPLIFICATION SUBSYSTEM PROVIDING AN AMPLIFIED LASER OUTPUT

REFERENCE TO RELATED APPLICATIONS

The present application is a continuation application of U.S. patent application Ser. No. 13/701,045, filed Jan. 3, 2013, entitled COHERENT OPTICAL AMPLIFIER, the disclosure of which is hereby incorporated by reference.

FIELD OF THE INVENTION

The present invention relates to laser systems generally.

BACKGROUND OF THE INVENTION

The following publications are believed to represent the current state of the art:

U.S. Pat. Nos. 6,400,871; 6,233,085; 5,896,219; 4,648,092; 6,882,781; 5,946,130; 6,580,534; 5,737,459; 6,717,719; 7,336,363; 4,860,279; 5,023,882; 7,088,743; 6,404,784; 6,144,677; 6,366,356; 6,678,294; 6,480,327; 4,757,268; 5,121,400; 4,761,059; 4,833,683; 4,979,804; 5,233,673; 6,200,309; 4,649,351; 5,661,747; 3,590,248; 7,239,777; 6,385,288; 4,794,345; 5,835,261; 5,539,571; 7,027,475; 7,187,492; 7,233,433; 7,058,098; 6,813,069 and 5,694,408;

U.S. Patent Publication 2006/0239312; and

"One Dimension Scaling of 100 Ridge Waveguide Amplifiers", K. H. No et al, IEEE Photonics Technology Letters, Vol. 6, No. 9, pp 1062-66.

SUMMARY OF THE INVENTION

The present invention seeks to provide improved laser systems.

There is thus provided in accordance with a preferred embodiment of the present invention a laser system including a seed laser, an optical amplification subsystem, receiving an output of the seed laser and providing an amplified laser output, the optical amplification subsystem including a first plurality of amplifier assemblies, each of the first plurality of amplifier assemblies including a second plurality of optical amplifiers and phase control circuitry including phase modulating functionality associated with each of the first plurality of amplifier assemblies.

There is also provided in accordance with another preferred embodiment of the present invention a laser system including a seed laser and an optical amplification system, receiving an output of the seed laser and providing an amplified laser output, the optical amplification system including a first plurality of amplifier assemblies and first phase control circuitry including phase modulating functionality associated with each of the first plurality of amplifier assemblies, each of the first plurality of amplifier assemblies including a second plurality of optical amplifiers and second phase control circuitry including phase modulating functionality associated with each of the second plurality of optical amplifiers, the second phase control circuitry including a total output intensity sensor which measures the total output intensity of the second plurality of optical amplifiers and phase control logic circuitry which receives an output from the total output intensity sensor and varies the phase relationships of individual ones of the second plurality of optical amplifiers in order to maximize the total output intensity of the laser system as sensed by the total output intensity sensor.

Preferably, the first phase control circuitry operates independently of the second phase control circuitry. Additionally or alternatively, the second phase control circuitry of each one of the first plurality of amplifier assemblies operates independently of the second phase control circuitry of each other of the first plurality of amplifier assemblies.

In accordance with a preferred embodiment of the present invention the phase control logic circuitry ascertains the current level supplied to each of the second plurality of optical amplifiers which produces the maximum total output intensity of the laser system. Alternatively or additionally, the phase control logic circuitry governs the phase of an external phase modulator associated with each of the second plurality of optical amplifiers which produces the maximum total output intensity of the laser system. Additionally or alternatively, the phase control logic circuitry sequentially varies the current supplied to each of the second plurality of optical amplifiers and selects the current level supplied to each of the second plurality of optical amplifiers to be the current which produces the maximum total output intensity of the laser system.

In accordance with a preferred embodiment of the present invention the phase control logic circuitry sequentially varies the phase of an external phase modulator associated with each of the second plurality of optical amplifiers and selects the phase of an external phase modulator associated with each of the second plurality of optical amplifiers to be the phase which produces the maximum total output intensity of the laser system.

Preferably, the phase control logic circuitry sequentially varies the phase of each of the second plurality of optical amplifiers and selects the phase of each of the second plurality of optical amplifiers to be the phase which produces the maximum total output intensity of the laser system. Additionally, multiple different ones of the second plurality of optical amplifiers are simultaneously supplied with current at different levels.

Preferably, the laser system also includes a coherent free-space far field combiner receiving outputs from at least one of the first and second pluralities of optical amplifiers and directing the outputs to a single mode optical fiber.

In accordance with a preferred embodiment of the present invention the laser system also includes a coherent free-space far field combiner receiving outputs having a first numerical aperture from at least one of the first and second pluralities of optical amplifiers and directing the outputs to an optical fiber having a second numerical aperture similar to the first numerical aperture.

Preferably, the laser system also includes a coherent free-space far field combiner receiving outputs from at least one of the first and second pluralities of optical amplifiers and coherently combining the outputs into a single beam having an at least nearly Gaussian profile. Additionally, brightness of the single beam is substantially higher than the brightness of a corresponding non-coherently combined beam.

There is further provided in accordance with yet another preferred embodiment of the present invention a laser system including a seed laser and an optical amplification subsystem, receiving an output of the seed laser and providing an amplified laser output, the optical amplification subsystem including a plurality of optical amplifiers and phase control circuitry sequentially varying the phase of each of the plurality of optical amplifiers and selecting the phase of each of the plurality of optical amplifiers to be the phase which produces the maximum total output intensity of the laser system.

Preferably, the phase control circuitry ascertains the current level supplied to each of the plurality of optical amplifiers which produces the maximum total output intensity of the laser system. Additionally or alternatively, the laser system also includes a coherent free-space far field combiner receiving outputs from the plurality of optical amplifiers and directing the outputs to a single mode optical fiber.

In accordance with a preferred embodiment of the present invention, the laser system also includes a coherent free-space far field combiner receiving outputs having a first numerical aperture from the plurality of optical amplifiers and directing the outputs to an optical fiber having a second numerical aperture similar to the first numerical aperture.

Preferably, the laser system also includes a coherent free-space far field combiner receiving outputs from the plurality of optical amplifiers and coherently combining the outputs into a single beam having an at least nearly Gaussian profile. Additionally, brightness of the single beam is substantially higher than the brightness of a corresponding non-coherently combined beam.

There is even further provided in accordance with still another preferred embodiment of the present invention a laser system including a seed laser and an optical amplification system, receiving an output of the seed laser and providing an amplified laser output, the optical amplification system including a plurality of optical amplifiers, an optical pathway directing an output from the seed laser to the first plurality of optical amplifiers and a coherent free-space far field combiner receiving outputs from the plurality of optical amplifiers and directing the outputs to a single mode optical fiber.

There is still further provided in accordance with yet another preferred embodiment of the present invention a laser system including a seed laser and an optical amplification system, receiving an output of the seed laser and providing an amplified laser output, the optical amplification system including a plurality of optical amplifiers, an optical pathway directing an output from the seed laser to the plurality of optical amplifiers and a coherent free-space fax field combiner receiving outputs having a first numerical aperture from the plurality of optical amplifiers and directing the outputs to an optical fiber having a numerical aperture similar to the first numerical aperture.

There is yet further provided in accordance with another preferred embodiment of the present invention a laser system including a seed laser and an optical amplification system, receiving an output of the seed laser and providing an amplified laser output, the optical amplification system including a plurality of optical amplifiers, an optical pathway directing an output from the seed laser to the plurality of optical amplifiers and a coherent free-space far field combiner receiving outputs from the plurality of optical amplifiers and combining the outputs into a single beam having an at least nearly Gaussian profile.

Preferably, brightness of the single beam is substantially higher than the brightness of a corresponding non-coherently combined beam.

There is also provided in accordance with still another preferred embodiment of the present invention a method of independently controlling the phase and output intensity of an optical amplifier including first and second gain sections, a first electrode associated with the first gain section and a second electrode associated with the second gain section, the method including changing the phase of the optical amplifier independently of the output intensity of the optical amplifier by varying current supplied via the first and second electrodes in a first manner and changing the output intensity of the optical amplifier independently of the phase of the optical amplifier by varying current supplied via the first and second electrodes in a second manner, different from the first manner.

Preferably, varying current supplied via the first and second electrodes in the first manner includes increasing the current supplied to the first electrode and decreasing the current supplied to the second electrode, such that the output intensity of the optical amplifier is unchanged.

In accordance with a preferred embodiment of the present invention varying current supplied via the first and second electrodes in the second manner includes changing the current supplied to the first and second electrodes by different amounts such that the phase of the optical amplifier is unchanged.

There is also provided in accordance with still another preferred embodiment of the present invention a method of independently controlling the phase and output intensity of an optical amplifier including the use of an external phase modulator associated with each of the optical amplifiers. A suitable external phase modulator may be a $LiNbO_3$ modulator, such as a LN65S-SC-10 GHz Phase Modulator, commercially available from Thorlabs Inc. of Newton, N.J. Alternatively, phase modulators which are operative by varying the temperature of each optical amplifier, by mechanically changing the length of the optical path for each optical amplifier or by employing any other standard phase modulation method may be used.

BRIEF DESCRIPTION OF THE DRAWINGS

The present invention will be understood and appreciated more fully from the following detailed description, taken in conjunction with the drawings in which:

FIG. 6A is a simplified illustration of an optical amplification and beam combining sub-subsystem constructed and operative in accordance with a preferred embodiment of the present invention, useful in the laser system of FIG. 5;

FIG. 6B is a simplified illustration of an optical amplification and beam combining sub-subsystem constructed and operative in accordance with another preferred embodiment of the present invention, useful in the laser system of FIG. 5;

DETAILED DESCRIPTION OF PREFERRED EMBODIMENTS

Figure 1:
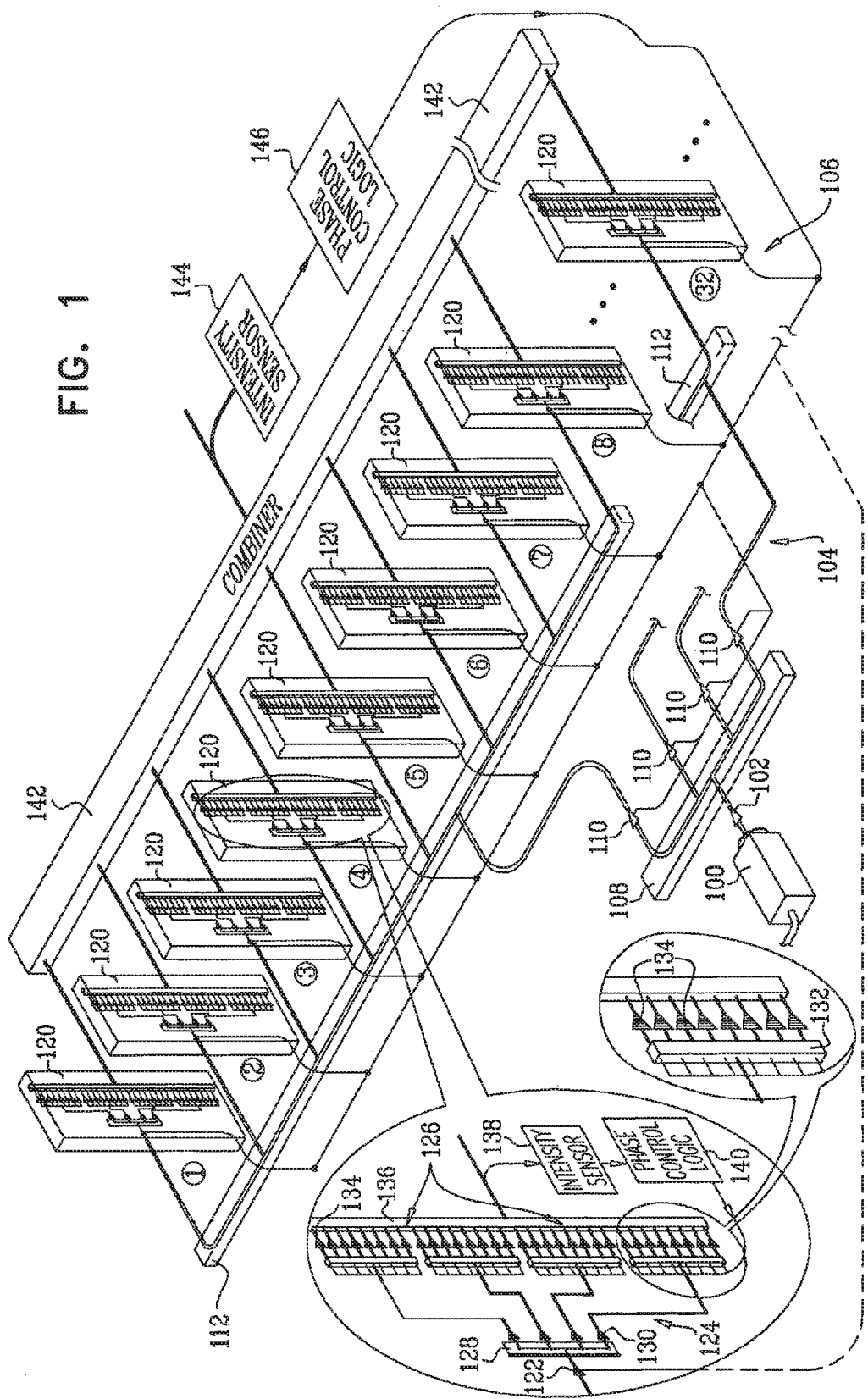
FIG. 1 is a simplified illustration of a laser system constructed and operative in accordance with a preferred embodiment of the present invention.

Reference is now made to FIG. 1, which is a simplified illustration of a laser system constructed and operative in accordance with a preferred embodiment of the present invention.

As seen in FIG. 1, there is provided a laser system including a seed laser 100, typically a 50 MW laser, such as a LU0976M150-1306E10A commercially available from Lumics GmbH of Berlin, Germany. The output of the seed laser 100 is amplified by an optical amplifier 102, preferably a tapered optical amplifier, such as a .BTA_976_2000_DHP from M2K Laser GmbH of Freiburg, Germany.

A current is supplied to an electrode of the optical amplifier. It is known that changes in the current level typically change both the phase and the intensity of the optical output of the amplifier.

It is a particular feature of an embodiment of the present invention that control of the currents to the ridge and taper electrodes of a tapered optical amplifier can vary the phase of its output without varying its output intensity.

This may be appreciated from the following discussion:

The current at each of the ridge and taper electrodes affects both intensity and phase of the light emitted from the tapered optical amplifier in accordance with the following known relationship:

$$\Theta_R = I_R \times A_{\Theta R}$$

$$\Theta_T = I_T \times A_{\Theta T}$$

$$P_R = I_R \times A_{PR}$$

$$P_T = I_T \times A_{PT}$$

The total intensity and phase herefore given by:

$$\Theta = I_R \times A_{\Theta R} + I_T \times A_{\Theta T}$$

$$P = I_R \times A_{PR} + I_T \times A_{PT}$$

It has been found by the present inventor that it is possible to find a set of values for the ridge electrode current and taper electrode current which allows variation of the phase of the output of a tapered optical amplifier without changing the intensity of the output.

Alternatively, modulation of the relative phases of the optical amplifiers may be realized by the use of external phase modulators associated with each of the optical amplifiers. Suitable external phase modulators may include an external phase modulator such as a LN65S-SC-10 GHz Phase Modulator available from Thorlabs Inc. of Newton, N.J. Alternatively phase modulators which are operative by varying the temperature of the optical amplifier, by mechanically changing the length of the optical path for each optical amplifier or by employing any other standard phase modulation method may be used.

The output of optical amplifier 102 is preferably coupled via a network 104 of optical fibers to an optical amplification subsystem 106, providing an amplified laser output. Preferably network 104 comprises polarization maintaining single mode fibers, such as PM780-HP fibers available from Thorlabs Inc. of Newton, N.J., which are joined via suitable beam splitters.

In a preferred embodiment of the invention, illustrated in FIG. 1, network 104 employs a 1×4 beam splitter 108, such as a PMC-1×N-3-4-2-2-2-0-0 from Micro Optics Inc. of Hackettstown, N.J., which receives the output of optical amplifier 102 and directs it to four optical amplifiers 110, arranged in parallel. The outputs of each of the four optical amplifiers 110 are each directed to a 1×8 beam splitter 112, such as a PMC-1×N-3-8-2-2-2-0-0 from Micro Optics Inc.

In accordance with a preferred embodiment of the present invention, the level of amplification provided by each of the optical amplifiers employed in the laser system is significantly below the maximum rated amplification of the amplifiers and is selected to maximize output coherence. More specifically, the level of amplification is selected to limit the amount of phase distortion and wavelength broadening as well as to limit noise and non-linear effects produced by the amplifier. The level of amplification is also selected to limit the amount of heat dissipation from each individual optical amplifier.

In accordance with a preferred embodiment of the present invention, the optical amplification subsystem 106 includes a first plurality of amplifier assemblies 120, each of which receives an input from a beam splitter 112. In accordance with a preferred embodiment of the present invention, 32 amplifier assemblies are employed, it being appreciated that a greater or lesser number may alternatively be employed. The components specifically described in the illustrated example have been found to be suitable for use in an optical amplification subsystem 106 including 32 amplifier assemblies.

In accordance with a preferred embodiment of the present invention, each of the first plurality of amplifier assemblies 120 includes a second plurality of optical amplifiers and phase control circuitry including phase modulating functionality associated with each of the second plurality of optical amplifiers.

As seen in FIG. 1, the second plurality of optical amplifiers which is included in each of the first plurality of amplifier assemblies 120 includes an optical amplifier 122, preferably a tapered optical amplifier, which receives one output of beam splitter 112. The output of optical amplifier 122 is preferably coupled via a network 124 of optical fibers to an optical amplification sub-subsystem 126, providing an amplified laser output. Preferably network 124 comprises polarization maintaining single mode fibers, such as PM780-HP fibers available from Thorlabs Inc., which are joined via suitable beam splitters.

In a preferred embodiment of the invention, illustrated in FIG. 1, network 124 employs a 1×4 beam splitter 128, such as a PMC-1×N-3-4-2-2-2-0-0 from Micro Optics Inc., which receives the output of optical amplifier 122 and directs it to four optical amplifiers 130, arranged in parallel. The outputs of each of the four optical amplifiers 130 are each directed to a 1×8 beam splitter 132, such as a PMC-1×N-3-8-2-2-2-0-0 from Micro Optics Inc.

In accordance with a preferred embodiment of the present invention, the optical amplification sub-subsystem 126 includes optical amplifiers 134, each of which receives an input from a beam splitter 132. In accordance with a preferred embodiment of the present invention, 32 optical amplifiers 134 are employed, it being appreciated that a greater or lesser number may alternatively be employed. The components specifically described in the illustrated example have been found to be suitable for use in an optical amplification sub-subsystem 126 including 32 optical amplifiers 134.

The coherent outputs of the optical amplifiers 134 are coherently combined by a coherent combiner 136, preferably of the type described hereinbelow with reference to FIGS. 4A & 4B. Part of the output of coherent combiner 136 is supplied to an intensity sensor 138, such as a PDA10CF from Thorlabs Inc. It is appreciated that output intensity can be maximized by adjusting the relative phase of the outputs of the individual optical amplifiers 134. In accordance with a preferred embodiment of the present invention, the output of intensity sensor 138 is received by phase control logic circuitry 140, preferably operative in the manner described hereinbelow with reference to FIGS. 2 and 3.

It is a particular feature of the present invention that phase control logic circuitry 140 is operative to modulate the relative phases of the second plurality of optical amplifiers, namely all or most of amplifiers 130 and 134, in a manner which maximizes the total output intensity of the second plurality of optical amplifiers. Preferably this is achieved by governing the current supplied to optical amplifiers 130 and 134. Alternatively, modulation of the relative phases of the optical amplifiers may be realized by the use of external phase modulators associated with each of the optical amplifiers. A suitable external phase modulator may be a LiNbO3 modulator such as a LN65S-SC-10 GHz Phase Modulator, commercially available from Thorlabs Inc. of Newton, N.J. Alternatively phase modulates which are operative by varying the temperature of the optical amplifier, by mechanically changing the length of the optical path for each optical amplifier or by employing any other standard phase modulation method may be used.

The remaining coherent outputs of each of coherent combiners 136 are coherently combined by a coherent combiner 142, preferably of the type described hereinbelow with reference to FIGS. 4A & 4B. Part of the output of coherent combiner 142 is supplied to an intensity sensor 144, such as PDA10CF from Thorlabs Inc. In accordance with a preferred embodiment of the present invention, the output of intensity sensor 144 is received by phase control logic circuitry 146, preferably operative in the manner described hereinbelow with reference to FIGS. 2 and 3, which governs the current supplied to optical amplifier 122.

It is a particular feature of the present invention that phase control logic circuitry 146 is operative to modulate the relative phases of the first plurality of amplifier assemblies 120, in a manner which maximizes the total output intensity of the first plurality of amplifier assemblies 120 independently of the operation of phase control logic circuitry 140.

It is noted that in an example of the embodiment shown above, optical amplifiers 102, 110, 122, 130 and 134 each having an output of between 1 and 10 Watt, which is currently optimal from the standpoint of phase distortion, wavelength broadening, noise, non-linear effects and heat dissipation are currently employed. It is appreciated that future optical amplifiers may have higher outputs which are optimal from the standpoint of phase distortion, wavelength broadening, noise, non-linear effects and heat dissipation. Such optical amplifiers, if and when available, may be employed in accordance with an embodiment of the present invention.

Thus, using approximate numbers, a 50 mW output of seed laser 100 produces 1 Watt at the output of optical amplifier 102; 1 Watt at the output of each of the four optical amplifiers 110; 1 Watt at the output of each of the 32 amplifiers 122; 1 Watt at the output of each of 128 amplifiers 130 and 1 watt at the output of each of 1024 amplifiers 134, for a total of 1024 Watt.

It is appreciated the system of FIG. 1 may be scaled up by a further factor of 32 by replacing each of optical amplifiers 134 by an amplifier assembly, such as amplifier assembly 120 which includes 32 optical amplifiers 134. Further scaling up may be realized in a similar manner.

It is appreciated that from the standpoint of heat dissipation, the system of FIG. 1 is highly scalable since the heat sources, e.g. the optical amplifiers, are distributed throughout the physical volume of the system and not concentrated in one location.

It is a particular feature of the present invention that the phase control functionality is highly scalable since it does not become more complex as the system is scaled up. Each phase control logic element, such as phase control logic 140 and 146 operates with only a maximum of 36 outputs, in the present example, and its operation is not coordinated with the operation of another phase control logic element or with an overall phase control system.

Figure 2:
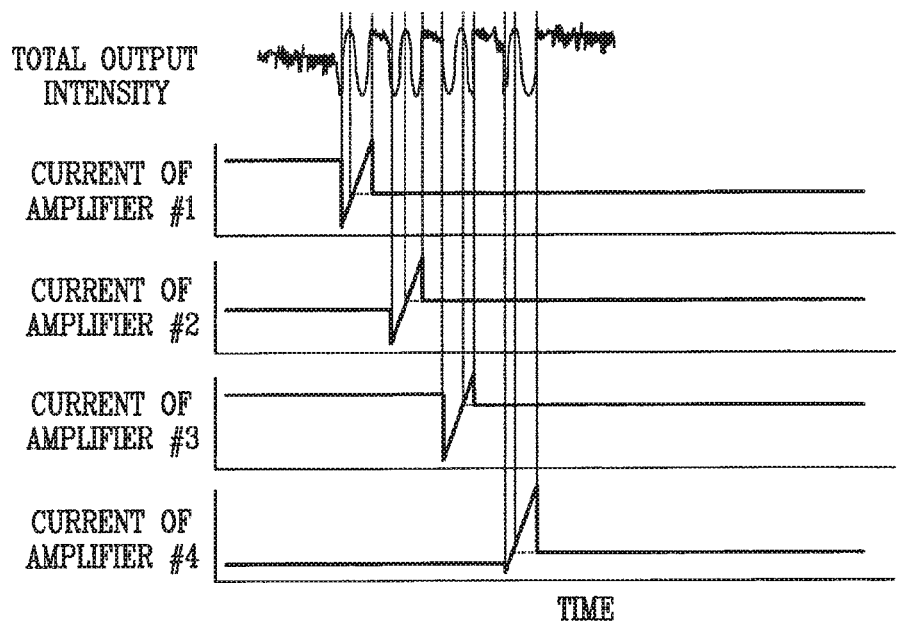
FIG. 2 is a simplified diagram illustrating total output intensity based phase modulation.
Figure 3:
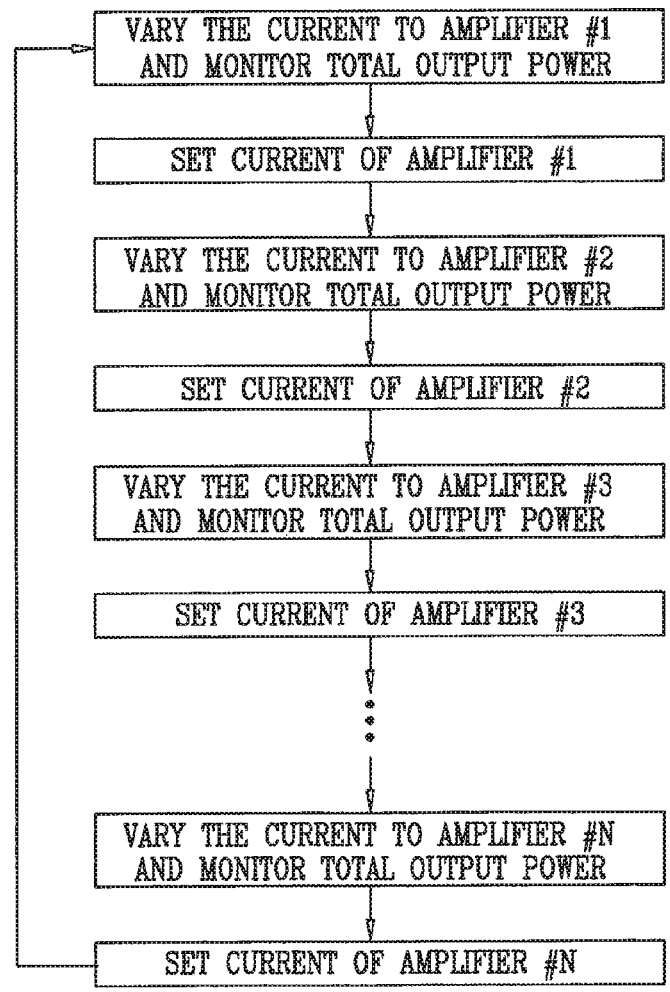
FIG. 3 is a simplified flow diagram illustrating the operation of the total output intensity based phase modulation of FIG. 2.

Reference is now made to FIG. 2, which is a simplified diagram illustrating total output intensity based phase modulation, and to FIG. 3, which is a simplified flow diagram illustrating the operation of the total output intensity based phase modulation of FIG. 2. The description Which follows is relevant equally to the operation of any and all of phase control logic elements 140 and 146 (FIG. 1).

Turning initially to FIG. 2, the top trace is the total output intensity as measured by an intensity sensor, such as intensity sensor 138 or 144 (FIG. 1). Intensity sensor 138 measures the total output intensity of each amplifier assembly 120 (FIG. 1). Intensity sensor 144 measures the total output intensity of the laser system including all of the amplifier assemblies 120 taken together.

The second, third, fourth and fifth traces represent the current supplied to respective first, second, third and fourth of a plurality of optical amplifiers, such as optical amplifiers 130 and 134 (FIG. 1), the current supplied to which governs the output intensity of each amplifier assembly 120 as measured by intensity sensor 138, or such as optical amplifiers 110 and 122 (FIG. 1), the current supplied to which governs the output intensity of the laser system including all of the amplifier assemblies 120 taken together, as measured by intensity sensor 144.

As set forth additionally in FIG. 3, referring to the phase control functionality provided by phase control logic 140, it is seen that the current supplied to each optical amplifier is varied, preferably by being reduced and thereafter immediately increased linearly in a ramp-like fashion. The total output intensity monitored by each intensity sensor 138 varies non-linearly as a function of the current supplied to the optical amplifier and reaches a local peak corresponding to a current level along the current ramp. The current level which corresponds to the local peak of total output intensity is set as the current level to that optical amplifier for the meantime.

The above process is repeated for all of the optical amplifiers 130 and 134 contributing to the total output which is measured by each intensity sensor 138, sequentially one after the other. Once the process has been completed for all of the optical amplifiers contributing to the total output which is measured by each intensity sensor 138, it is repeated endlessly. It is a particular feature of the present invention that selection of the input current to each optical amplifier contributing to the total output which is measured by each intensity sensor 138 takes place without taking into account the input current supplied to the other optical amplifiers contributing to the total output which is measured by that intensity sensor 138.

As set forth additionally in FIG. 3, referring to the phase control functionality provided by phase control logic 146, it is seen that the current supplied to each optical amplifier 110 and 122 is varied, preferably by being reduced and thereafter immediately increased linearly in a ramp-like fashion. The total output intensity monitored by intensity sensor 144 varies non-linearly as a function of the current supplied to the optical amplifier and reaches a local peak corresponding to a current level along the current ramp. The current level which corresponds to the local peak of total output intensity is set as the current level to that optical amplifier for the meantime.

The above process is repeated for all of the optical amplifiers 110 and 122 contributing to the total output which is measured by intensity sensor 144, sequentially one after the other. Once the process has been completed for all of the optical amplifiers contributing to the total output which is measured by intensity sensor 144, it is repeated endlessly. It is a particular feature of the present invention that selection of the input current to each of optical amplifier 110 and 122 contributing to the total output which is measured by intensity sensor 144 takes place without taking into account the input current supplied to the other ones of optical amplifiers 110 and 122, contributing to the total output which is measured by intensity sensor 144.

It is a particular feature of the present invention that during normal operation the phase control functionality carried out by phase control logic 146 can and preferably does take place independently and without reference to the phase control functionality carried out by each phase control logic element 140 and further that the phase control functionality carried out by each phase control logic element 140 can and preferably does take place independently and without reference to the phase control functionality carried out by all other phase control logic elements 140.

It is appreciated that although in a preferred embodiment of the present invention, tapered optical amplifiers are employed, alternatively other suitable types of optical amplifiers, such as, for example, erbium-doped fiber amplifiers (EDFA), semiconductor optical amplifiers (SOA) and solid state optical amplifiers, may be employed.

It is also appreciated that, although in a preferred embodiment of the present invention, phase modulation is achieved by varying the current of the amplifier, other types of phase modulation may be used, such as, for example, using an external phase modulator, such as a LN65S-SC-10 GHz Phase Modulator available from Thorlabs Inc. of Newton, N.J. Alternatively, phase modulators which are operative by varying the temperature of each optical amplifier, by mechanically changing the length of the optical path for each optical amplifier or by employing any other standard phase modulation method may be used.

Figure 4A:
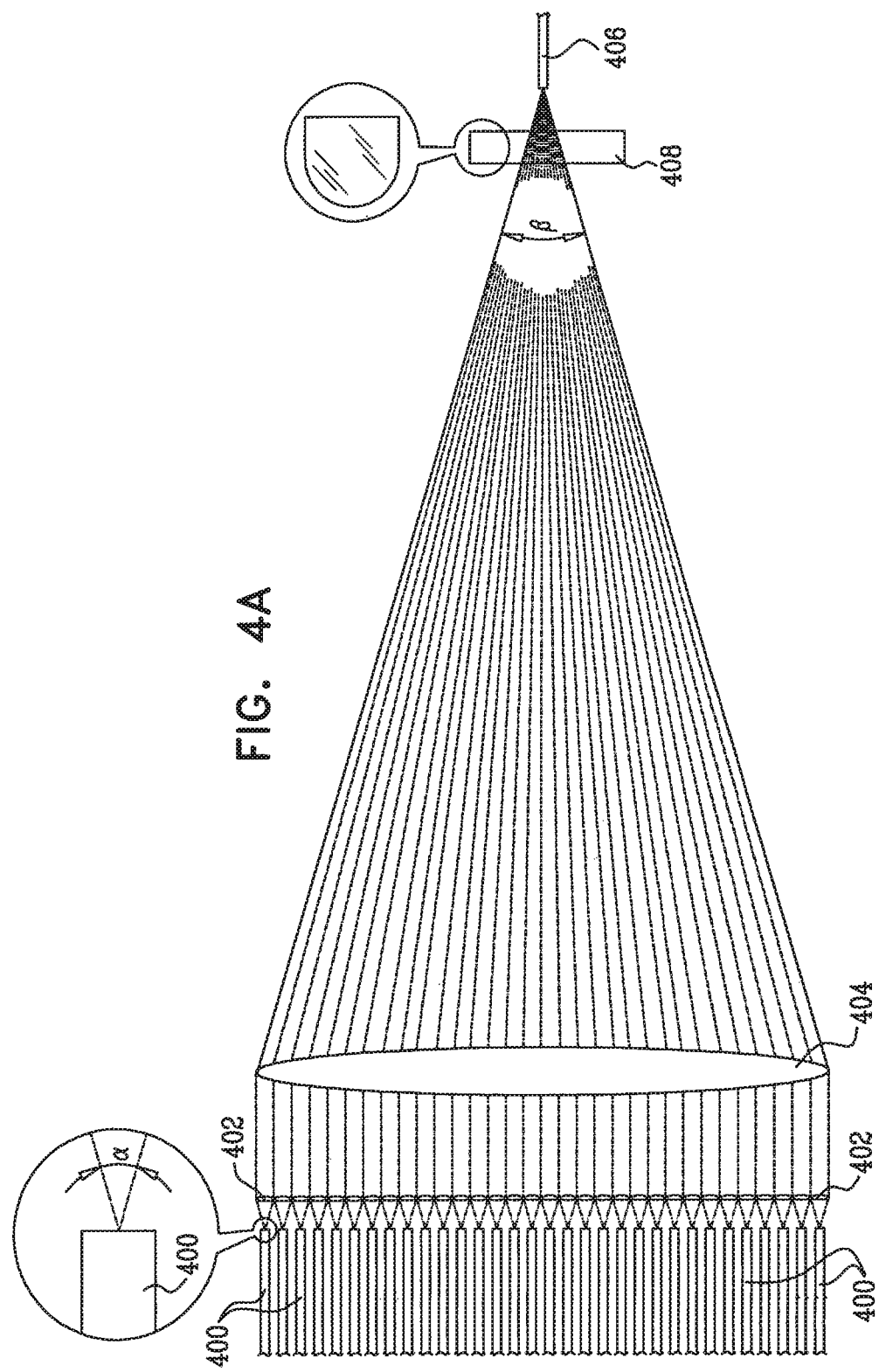
FIG. 4A is a simplified illustration of an optical coherent combiner constructed and operative in accordance with a preferred embodiment of the present invention, useful in the laser system of FIGS. 1-3.

Reference is now made to FIG. 4A, which is a simplified illustration of a coherent optical combiner constructed and operative in accordance with a preferred embodiment of the present invention, useful in the laser system of FIGS. 1, 7, 8, 9 and 10. In the context of FIG. 1, for example, the combiner may serve as combiner 136 or as combiner 142.

As seen in FIG. 4A, a plurality of optical fibers 400, each of which represents the output of an optical amplifier 134, in the case of combiner 136, or of amplifier assembly 120, in the case of combiner 142, are preferably arranged in a side by side arrangement along a single line. A corresponding plurality of collimating lenses 402 are each arranged to receive substantially the entire light output of a corresponding optical fiber 400.

A preferred construction requires that the light beam output by each of the optical fibers 400 cover substantially the entire area of each corresponding collimating lens 402. This may be expressed by the constraint that the numerical aperture of each optical fiber 400, represented by angle alpha ($\alpha$), is similar to the numerical aperture of each corresponding collimating lens 402. Preferably, the numerical aperture of each optical fiber 400 is ±15% the numerical aperture of each corresponding collimating lens 402. Most preferably, the numerical aperture of each optical fiber 400 is equal to the numerical aperture of each corresponding collimating lens 402.

A plurality of collimated light beams from the plurality of collimating lenses 402 impinges on a cylindrical focusing lens 404. Cylindrical focusing lens 404 is arranged to receive substantially the entire light output of all of collimating lenses 402.

Cylindrical focusing lens 404 focuses a beam of light from the plurality of collimating lenses 402 in the plane of FIG. 4A to a receiving optical fiber 406. It is a particular feature of the present invention that the brightness of the coherent beam which is focused on the receiving optical fiber 406 is substantially higher than the brightness of a non-coherent beam in the same configuration. It is thus appreciated that, were a non-coherent beam emitted from the plurality of optical fibers 400, it would have a much lower brightness than the brightness of a coherent beam. The numerical aperture of the receiving optical fiber 406, represented by the angle beta ($\beta$), is similar to the numerical aperture of each optical fiber 400, represented by angle alpha ($\alpha$). Preferably, the numerical aperture of the receiving optical fiber 406 is ±15% the numerical aperture of each optical fiber 400. In the exemplary preferred embodiment shown in FIG. 4A, the cross sectional area of receiving optical fiber 406 is identical to the cross sectional area of each of optical fibers 400 and the numerical aperture of the receiving optical fiber 406, represented by the angle beta ($\beta$), is equal to the numerical aperture of each optical fiber 400, represented by angle alpha ($\alpha$). It is appreciated that the coherent property of the beam enables substantially all of the light output by all of the optical fibers 400 to be collected by receiving optical fiber 406.

It is appreciated that focusing of light in a plane orthogonal to the plane of FIG. 4A, to the extent needed, may be provided by a cylindrical lens 408. It is also appreciated that if the fibers 400 are arranged in a two dimensional bundle, focusing lens 404 need not necessarily be a cylindrical lens and cylindrical lens 408 may be obviated.

Figure 4B:
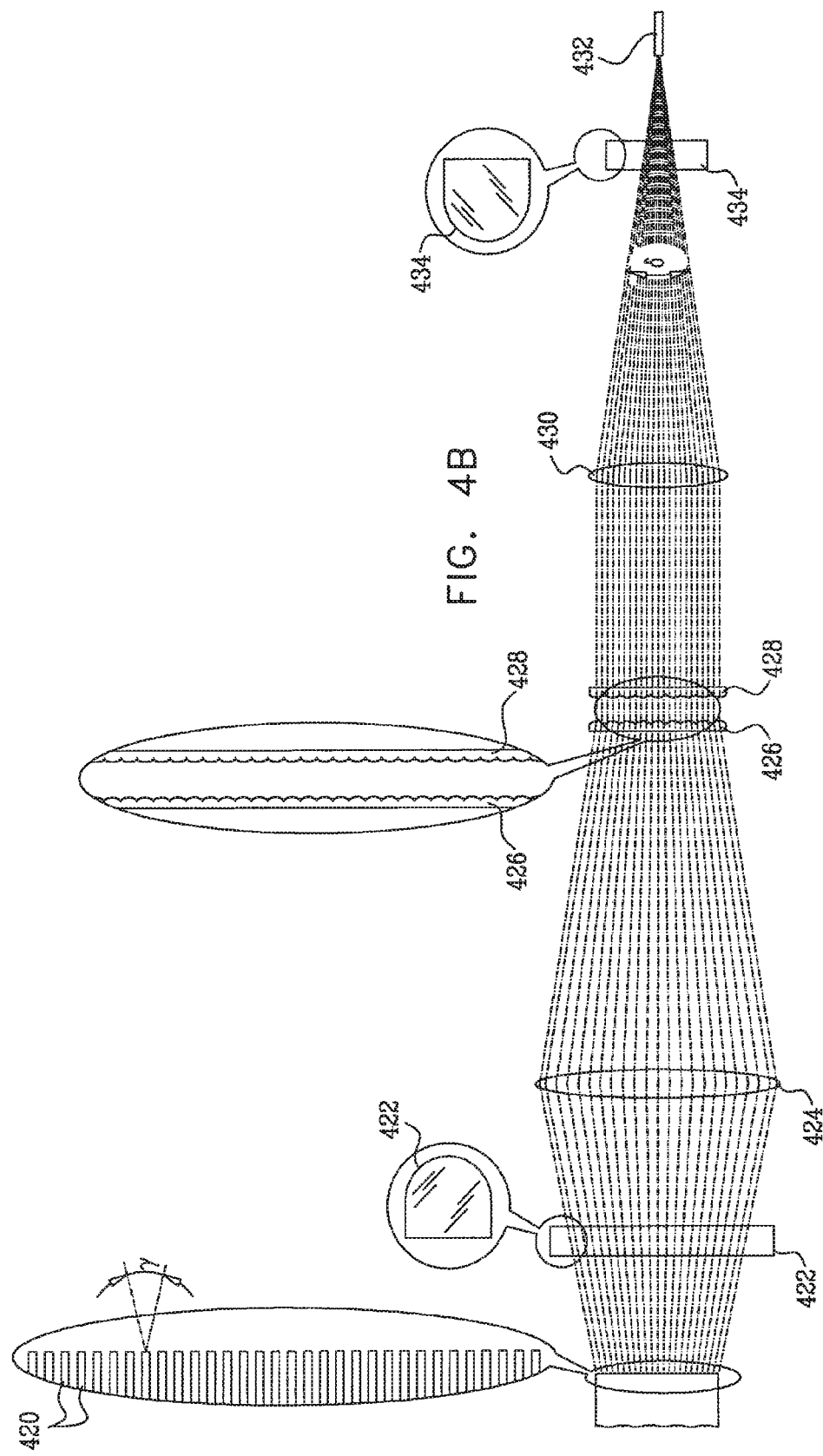
FIG. 4B is a simplified illustration of an optical coherent combiner constructed and operative in accordance with another preferred embodiment of the present invention, useful in the laser system of FIGS. 1-3.

In a specific example of the embodiment of FIG. 4A, the following approximate parameter values may be employed:
  number of optical fibers 400—32
  pitch of optical fibers 400—1 mm
  number of collimating lenses 402—32
  pitch of collimating lenses 402—1 mm
  focal length of each of collimating lenses 402—5 mm
  focal length f of cylindrical focusing lens 404—160 mm Reference is now made to FIG. 4B, which is a simplified illustration of an optical coherent combiner constructed and operative in accordance with another preferred embodiment of the present invention, useful in the laser system of FIGS. 1, 7, 8, 9 and 10. In the context of FIG. 1, the combiner may serve as combiner 136 or as combiner 142.

As seen in FIG. 4B, a plurality of optical fibers 420, each of which represents the output of an optical amplifier 134, in the case of combiner 136, or of amplifier assembly 120, in the case of combiner 142, are preferably arranged in a side by side arrangement along a single line. A cylindrical collimating lens 422 collimates the light from optical fibers 420 in a direction orthogonal to the plane of FIG. 4B and directs it to a cylindrical lens 424, having a focal length f, which is positioned at a distance f from the plurality of optical fibers 420 and receives substantially the entire total light output of the optical fibers.

It is a particular feature of this embodiment of the present invention that a pair of lens arrays 426 and 428 is positioned at a suitable distance, such as distance f, from the cylindrical lens 424 and receives substantially the entire total light output of lens 424. The lens arrays 426 and 428 are identical and are aligned and mutually spaced by a distance g, which is equal to the focal length of each of the lenses in arrays 426 and 428. Lens arrays 426 and 428 together produce a single beam of light which impinges on a focusing lens 430.

Focusing lens 430 focuses substantially all of the light output from lens arrays 426 and 428 onto a receiving optical fiber 432, which preferably has a cross sectional area identical to that of each of optical fibers 420.

As noted above with reference to the embodiment of FIG. 4A, also in the embodiment of FIG. 4B, it is a particular feature of the present invention that the brightness of the coherent beam which is focused on the receiving optical fiber 432 is substantially higher than the brightness of a non-coherent beam in the same configuration. It is thus appreciated that, were a non-coherent beam emitted from the plurality of optical fibers 420 it would have a much lower brightness than the brightness of a coherent beam. The numerical aperture of the receiving optical fiber 432, represented by the angle delta ($\delta$), is similar to the numerical aperture of each optical fiber 420, represented by angle gamma ($\gamma$). Preferably, the numerical aperture of the receiving optical fiber 432 is ±15% the numerical aperture of each optical fiber 400. In the exemplary preferred embodiment shown in FIG. 4B, the cross sectional area of receiving optical fiber 432 is identical to the cross sectional area of each of optical fibers 420 and the numerical aperture of the receiving optical fiber 432, represented by the angle delta ($\delta$), is equal to the numerical aperture of each optical fiber 420, represented by angle gamma ($\gamma$). It is appreciated that the coherent property of the beam enables substantially all of the light output by all of the optical fibers 420 to be collected by receiving optical fiber 432.

It is appreciated that focusing of light in a plane orthogonal to the plane of FIG. 4B, to the extent needed, may be provided by a cylindrical lens 434. It is also appreciated that if the optical fibers 420 are arranged in a two dimensional bundle, cylindrical lenses 422 and 434 may be obviated.

In a specific example of the embodiment of FIG. 4B, the following approximate parameter values may be employed:
  Wavelength—970 nm
  number of optical fibers 420—32
  pitch of optical fibers 420—250 microns
  focal length f of cylindrical lens 424—32.2 mm
  minimal number of lenses in each of arrays 426 and 428—42
  pitch of lenses in each of arrays 426 and 428—125 microns
  focal length g of each of lenses in each of arrays 426 and 428—502 microns.

Figure 5:
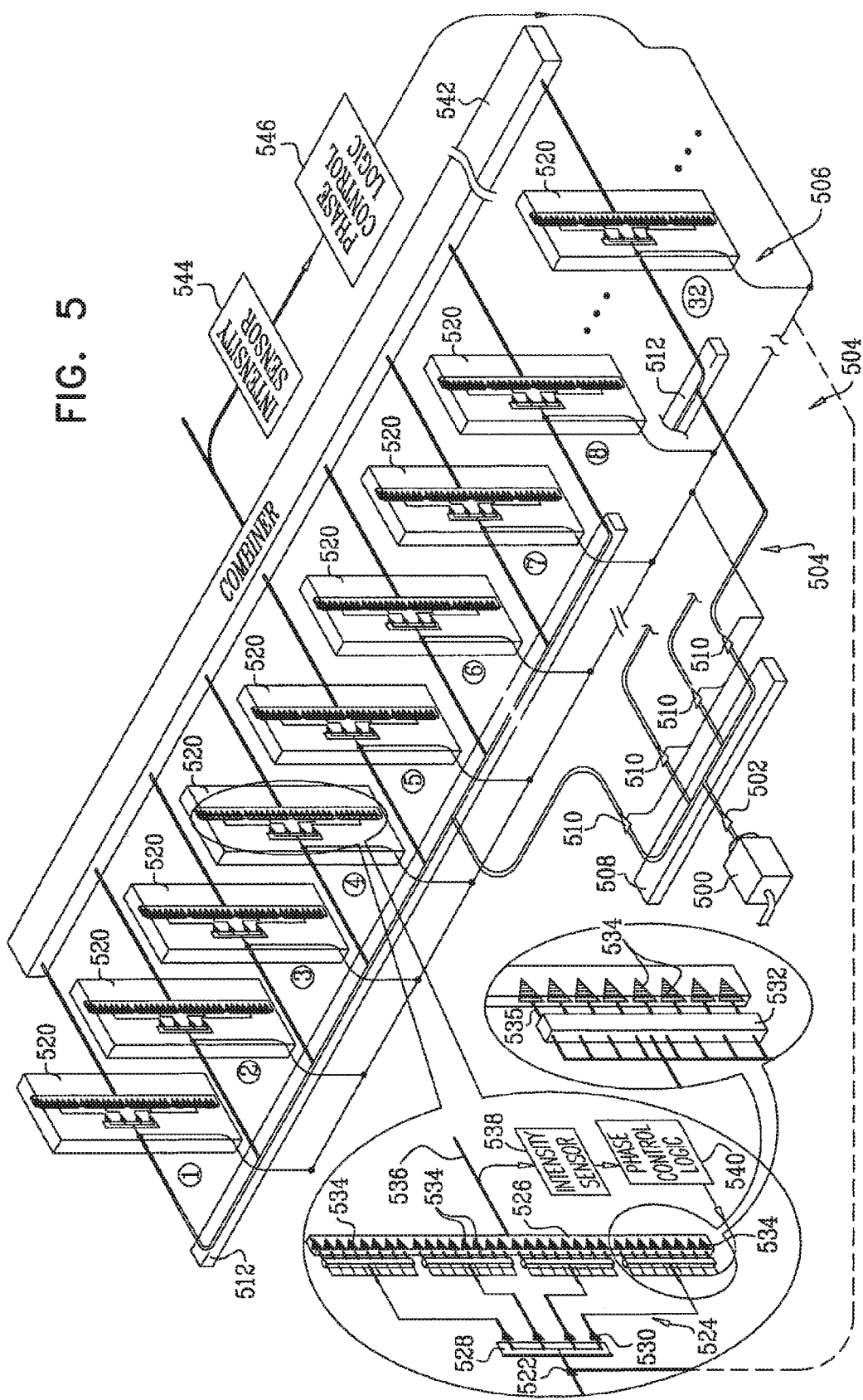
FIG. 5 is a simplified illustration of a laser system constructed and operative in accordance with another preferred embodiment of the present invention.

Reference is now made to FIG. 5, which is a simplified illustration of a laser system constructed and operative in accordance with another preferred embodiment of the present invention.

As seen in FIG. 5, there is provided a laser system including a seed laser 500, typically a 50 MW laser, such as a LU0976M150-1306E10A commercially available from Lumics Inc. The output of the seed laser 500 is amplified by an optical amplifier 502. The output of optical amplifier 502 is preferably coupled via a network 504 of optical fibers to an optical amplification subsystem, providing an amplified laser output. Preferably network 504 comprises polarization maintaining single mode fibers, such as PM780-HP fibers available from Thorlabs Inc., which are joined via suitable beam splitters.

In a preferred embodiment of the invention, illustrated in FIG. 5, network 504 employs a 1×4 beam splitter 508, such as a PMC-1×N-3-4-2-2-2-0-0 from Micro Optics Inc., which receives the output of optical amplifier 502 and directs it to four optical amplifiers 510, arranged in parallel. The outputs of each of the ten optical amplifiers 510 are each directed to a 1×8 beam splitter 512, such as a PMC-1×N-3-8-2-2-2-0-0 from Micro Optics Inc.

In accordance with a preferred embodiment of the present invention, the level of amplification provided by each of the optical amplifiers employed in the laser system is significantly below the maximum rated amplification of the amplifiers and is selected to maximize output coherence. More specifically, the level of amplification is selected to limit the amount of phase distortion and wavelength broadening as well as to limit noise and non-linear effects produced by the amplifier. The level of amplification is also selected to limit the amount of heat dissipation from each individual optical amplifier.

In accordance with a preferred embodiment of the present invention, the optical amplification subsystem 506 includes a first plurality of amplifier assemblies 520, each of which receives an input from a beam splitter 512. In accordance with a preferred embodiment of the present invention, 32 amplifier assemblies 520 are employed, it being appreciated that a greater or lesser number may alternatively be employed. The components specifically described in the illustrated example have been found to be suitable for use in an optical amplification system 506 including 32 amplifier assemblies 520.

In accordance with a preferred embodiment of the present invention, each of the first plurality of amplifier assemblies 520 includes a second plurality of optical amplifiers and phase control circuitry including phase modulating functionality associated with each of the second plurality of optical amplifiers.

As seen in FIG. 5, the second plurality of optical amplifiers which is included in each of the first plurality of amplifier assemblies 520 includes an optical amplifier 522, preferably a tapered optical amplifier, which receives one output of beam splitter 512. The output of optical amplifier 522 is preferably coupled via a network 524 of optical fibers to an optical amplification and beam combining sub-sub-system 526, providing an amplified laser output. Preferably network 524 comprises polarization maintaining single mode fibers, such as PM780-HP fibers, available from Thorlabs Inc., which are joined via suitable beam splitters.

In a preferred embodiment of the invention, illustrated in FIG. 5, network 524 employs a 1×4 beam splitter 528, such as PMC-1×N-3-4-2-2-2-0-0 from Micro Optics Inc., which receives the output of optical amplifier 522 and directs it to four optical amplifiers 530, arranged in parallel. The outputs of each of the four optical amplifiers 530 are each directed to a 1×8 beam splitter 532, such as PMC-1×N-3-8-2-2-2-0-0 from Micro Optics Inc.

In accordance with a preferred embodiment of the present invention, the optical amplification and beam combining sub-subsystem 526 includes optical amplifiers 534, each of which receives an input from a beam splitter 532 via and optical fiber 535. In accordance with a preferred embodiment of the present invention, 32 optical amplifiers 534 are employed, it being appreciated that a greater or lesser number may alternatively be employed. The components specifically described in the illustrated example have been found to be suitable for use in an optical amplification and beam combining sub-subsystem 526 including 32 optical amplifiers 534, which are coherently combined in free space into a single output 536. A preferred embodiment of optical amplification and beam combining sub-subsystem 526 is described hereinbelow with reference to either of FIGS. 6A & 6B.

Part of the output 536 is supplied to an intensity sensor 538, such as PDA10CF from Thorlabs Inc. It is appreciated that output intensity can be maximized by adjusting the relative phase of the outputs of the individual optical amplifiers 534. In accordance with a preferred embodiment of the present invention, the output of intensity sensor 538 is received by phase control logic circuitry 540, preferably operative in the manner described hereinabove with reference to FIGS. 2 and 3.

It is a particular feature of the present invention that phase control logic circuitry 540 is operative to modulate the relative phases of the second plurality of optical amplifiers, namely all or most of amplifiers 530 and 534, in a manner which maximizes the total output intensity of the second plurality of optical amplifiers by governing the current supplied to optical amplifiers 530 and 534 or by employing an external phase modulator associated with each of said amplifiers 530 and 534.

The remaining coherent outputs 536 are coherently combined by a coherent combiner 542, preferably of the type described hereinbelow with reference to FIGS. 6A & 6B. Part of the output of combiner 542 is supplied to an intensity sensor 544, such as PDA10CF from Thorlabs Inc. In accordance with a preferred embodiment of the present invention, the output of intensity sensor 544 is received by phase control logic circuitry 546, preferably operative in the manner described hereinabove with reference to FIGS. 2 and 3, which governs the current supplied to optical amplifier 522 or employs an external phase modulator associated with said amplifier 522.

It is a particular feature of the present invention that phase control logic circuitry 546 is operative to modulate the relative phases of the first plurality of amplifier assemblies 520, in a manner which maximizes the total output intensity of the first plurality of amplifier assemblies 520 independently of the operation of phase control logic circuitry 540.

It is noted that in an example of the embodiment described herein, optical amplifiers 502, 510, 522, 530 and 534, each having an output of between 1 and 10 Watt, which is currently optimal from the standpoint of phase distortion, wavelength broadening, noise, non-linear effects and heat dissipation, are currently employed. It is appreciated that future optical amplifiers may have higher outputs which are optimal from the standpoint of phase distortion, wavelength broadening, noise, non-linear effects and heat dissipation. Such optical amplifiers, if and when available, may be employed in accordance with an embodiment of the present invention.

Thus, using approximate numbers, a 50 mW output of seed laser 500 produces 1 Watt at the output of optical amplifier 502; 1 Watt at the output of each of the four optical amplifiers 510; 1 Watt at the output of each of the 32 amplifiers 522; 1 Watt at the output of each of 128 amplifiers 530 and 1 watt at the output of each of 1024 amplifiers 534, for a total of 1024 Watt.

It is appreciated that the system of FIG. 5 may be scaled up by a further factor of 32 by replacing each of optical amplifiers 534 by an amplifier assembly, such as amplifier assembly 520 which includes 32 optical amplifiers 534. Further scaling up may be realized in a similar manner.

It is appreciated that from the standpoint of heat dissipation, the system of FIG. 5 is highly scalable since the heat sources, e.g. the optical amplifiers, are distributed throughout the physical volume of the system and not concentrated in one location.

It is a particular feature of the present invention that the phase control functionality is highly scalable since it does not become more complex as the system is scaled up. Each phase control logic element, such as phase control logic 540 and 546, operates with only a maximum of 36 outputs, in the present example, and its operation is not coordinated with the operation of another phase control logic element or with an overall phase control system.

Reference is now made to FIG. 6A, which is a simplified illustration of an optical amplification and beam combining subsystem constructed and operative in accordance with a preferred embodiment of the present invention, useful in the laser system of FIGS. 5, 7, 8, 9 and 10.

As seen in FIG. 6A, a plurality of optical fibers 535 (FIG. 5), each of which represents the output of a beam splitter 532 (FIG. 5) are coupled to a corresponding plurality of optical amplifiers 534 (FIG. 5), each of which are arranged to receive light output of a corresponding optical fiber 535. Optical amplifiers 534 are preferably arranged in a side by side arrangement along a single line. A corresponding plurality of collimating lenses 602 are each arranged to receive substantially the entire light output of a corresponding optical amplifier 534.

A preferred construction requires that the light beam output by each of the optical amplifiers 534 cover substantially the entire area of each corresponding collimating lens 602. This may be expressed by the constraint that the numerical aperture of the output of each of optical amplifiers 534, represented by angle alpha ($\alpha$), is equal to the numerical aperture of each corresponding collimating lens 602. It is appreciated that collimating lens 602 may have a numerical aperture in the plane of FIG. 6A which is different than the numerical aperture in the direction with is perpendicular to the plane of FIG. 6A, such as lens 9003-505 from LIMO Lissotschenko Mikrooptik GmbH.

A plurality of collimated light beams from the plurality of collimating lenses 602 impinges on a cylindrical focusing lens 604. Cylindrical focusing lens 604 is arranged to receive substantially the entire light output of all of collimating lenses 602.

Cylindrical focusing lens 604 focuses the light from the plurality of collimating lenses 602 in the plane of FIG. 6A to a receiving optical fiber 606. It is a particular feature of the present invention that the brightness of the coherent beam which is focused on the receiving optical fiber 606 is substantially higher than the brightness of a non-coherent beam in the same configuration. It is thus appreciated that, were a non-coherent beam emitted from the plurality of optical amplifiers 534, it would have a much lower brightness than the brightness of a coherent beam. It is appreciated that the coherent property of the beam enables substantially all of the light output by all of the optical amplifiers 534 to be collected by receiving optical fiber 606.

It is appreciated that focusing of light in a plane orthogonal to the plane of FIG. 6A, to the extent needed, may be provided by a cylindrical lens 608. It is also appreciated that if the outputs of each of optical amplifiers 534 are arranged in a two dimensional bundle, focusing lens 604 need not necessarily be a cylindrical lens and cylindrical lens 608 may be obviated.

In a specific example of the embodiment of FIG. 6A, the following approximate parameter values may be employed:
number of optical amplifiers 534—32
pitch of outputs of optical amplifiers 534—1 mm
number of lenses 602—32
pitch of lenses 602—1 mm
focal length of each of lenses 602—5 mm
focal length f of cylindrical focusing lens 604—160 mm Reference is now made to FIG. 6B, which is a simplified illustration of an optical amplification and beam combining subsystem constructed and operative in accordance with another preferred embodiment of the present invention, useful in the laser system of FIGS. 5, 7, 8, 9 and 10.

As seen in FIG. 6B, a plurality of optical fibers 535 (FIG. 5), each of which represents the output of a beam splitter 532 (FIG. 5) are coupled to a corresponding plurality of optical amplifiers 534 (FIG. 5), each of which are arranged to receive light output of a corresponding optical fiber 535. Optical amplifiers 534 are preferably arranged in a side by side arrangement along a single line.

A cylindrical collimating lens 622 collimates the light from the outputs of optical amplifiers 534 in a direction orthogonal to the plane of FIG. 6B and directs it to a cylindrical lens 624, having a focal length f, which is positioned at a distance f from the outputs of the optical amplifiers 534 and receives substantially the entire total light output thereof.

It is a particular feature of this embodiment of the present invention that a pair of lens arrays 626 and 628 is positioned at a suitable distance, such as distance f, from the cylindrical lens 624 and receives substantially the entire total light output of lens 624. The lens arrays 626 and 628 are identical and are aligned and mutually spaced by a distance g, which is equal to the focal length of each of the lenses in arrays 626 and 628. Lens arrays 626 and 628 together produce a single beam of light which impinges on a focusing lens 630.

Focusing lens 630 focuses substantially all of the light output from lens arrays 626 and 628 onto a receiving optical fiber 632.

As noted above with reference to the embodiment of FIG. 6A, also in the embodiment of FIG. 6B, it is a particular feature of the present invention that the brightness of the coherent beam which is focused on the receiving optical fiber 632 is substantially higher than the brightness of a non-coherent beam in the same configuration. It is thus appreciated that, were a non-coherent beam emitted from the plurality of optical amplifiers 534 it would have a much lower brightness than the brightness of a coherent beam. It is appreciated that the coherent property of the beam enables substantially all of the light output by all of the optical amplifiers 534 to be collected by receiving optical fiber 632.

It is appreciated that focusing of light in a plane orthogonal to the plane of FIG. 6B, to the extent needed, may be provided by a cylindrical lens 634. It is also appreciated that if the outputs of optical amplifiers 534 are arranged in a two-dimensional bundle, cylindrical lenses 622 and 634 may be obviated.

Figure 7:
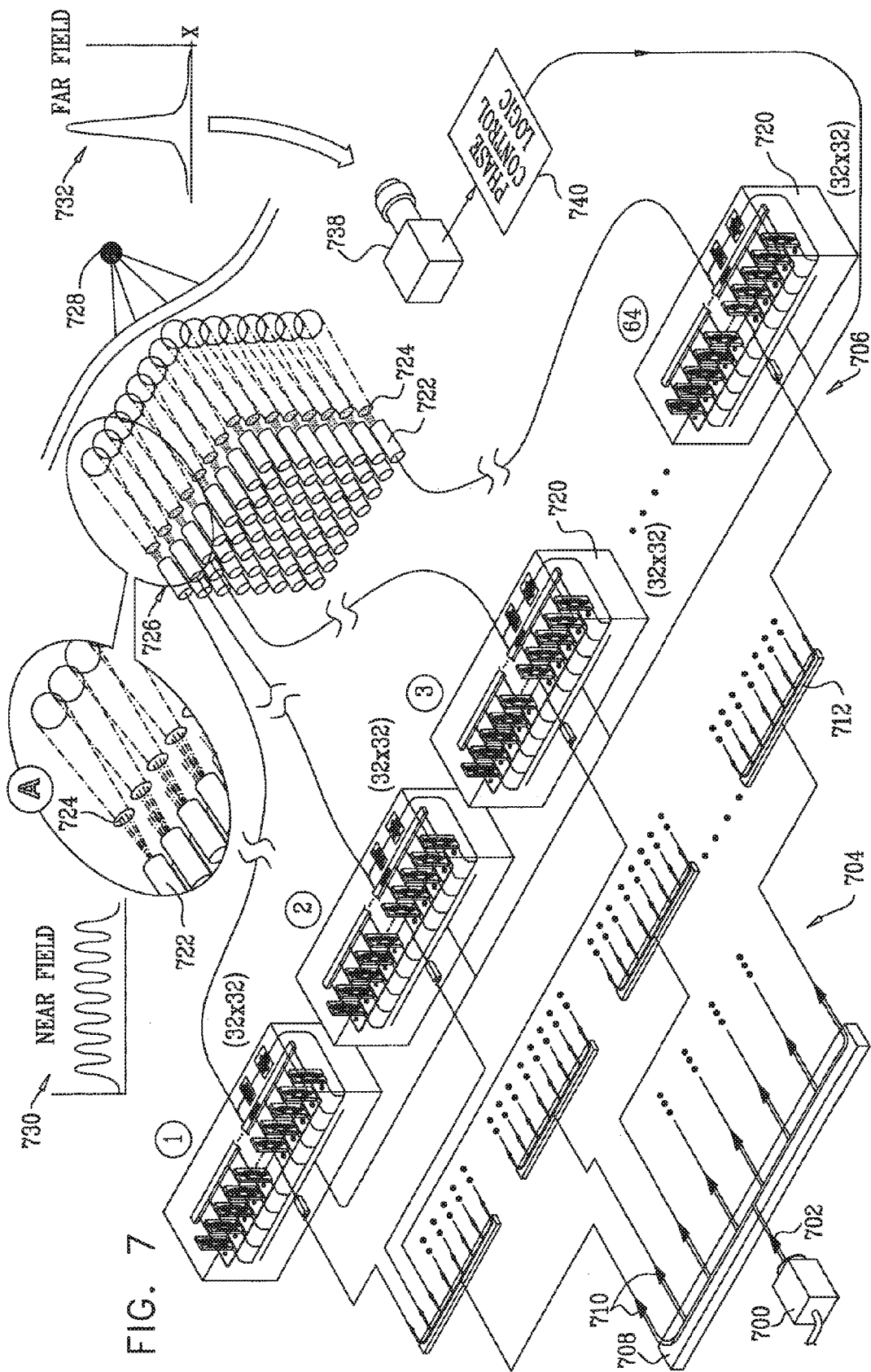
FIG. 7 is a simplified illustration of a laser system constructed and operative in accordance with another preferred embodiment of the present invention.

In a specific example of the embodiment of FIG. 6B, the following approximate parameter values may be employed:
Wavelength—970 nm
number of optical amplifiers 534—32
pitch of outputs of optical amplifiers 534—250 microns
focal length f of cylindrical lens 624—32.2 mm
minimal number of lenses in each of arrays 626 and 628—42
pitch of lenses in each of arrays 626 and 628—125 microns
focal length g of each of lenses in each of arrays 626 and 628—502 microns Reference is now made to FIG. 7 which is a simplified illustration of a laser system constructed and operative in accordance with another preferred embodiment of the present invention. FIG. 7 exemplifies a further scale up of the system of either of FIGS. 1 and 5.

As seen in FIG. 7, there is provided a laser system including a seed laser 700, typically a 50 MW laser, such as a LU0976M150-1306E10A commercially available from Lumics Inc. The output of the seed laser 700 is amplified by an optical amplifier 702, preferably a tapered optical amplifier. The output of optical amplifier 702 is preferably coupled via a network 704 of optical fibers to an optical amplification supersystem 706, providing an amplified laser output. Preferably network 704 comprises polarization maintaining single mode fibers, such as PM780-HP fibers available from Thorlabs Inc., which are joined via suitable beam splitters.

In a preferred embodiment of the invention, illustrated in FIG. 7, network 704 employs a 1×8 beam splitter 708, such as a PMC-1×N-3-8-2-2-2-0-0 from Micro Optics Inc., which receives the output of optical amplifier 702 and directs it to eight optical amplifiers 710, arranged in parallel. The outputs of each of the eight optical amplifiers 710 are each directed to a 1×8 beam splitter 712, such as a PMC-1×N-3-8-2-2-2-0-0 from Micro Optics Inc.

In accordance with a preferred embodiment of the present invention, the optical amplification supersystem 706 includes a plurality of amplification systems 720, each of which typically includes all of the apparatus shown in FIG. 1 downstream of the seed laser 100 or all of the apparatus shown in FIG. 5 downstream of the seed laser 500 (FIG. 5). The outputs of combiners 142 (FIG. 1) or combiners 542 (FIG. 5) are supplied via optical fibers 722 to respective collimating lenses 724. Optical fibers 722 are preferably large area mode fibers which can carry light at a kilowatt power level, commercially available from Nufern, 7 Airport Park Road, East Granby, Conn. 06026. The output ends of optical fibers 722 are preferably arranged in a two-dimensional array 726. The separate outputs of collimating lenses 724, preferably as seen in enlargement A, each propagate and diverge in free space and, at a suitable propagation distance from lenses 724, combine in a far field pattern, designated by reference numeral 728. A spatial intensity diagram of a near field pattern corresponding to the outputs of collimating lenses 724 is designated by reference numeral 730. A spatial intensity diagram of the far field pattern 728 is designated by reference numeral 732. It is seen that a preferred far field pattern has an intensity profile which is an at least nearly Gaussian profile, as illustrated in diagram 732.

The intensity profile of the far field pattern 728 may be governed by controlling the relative phases of amplifiers 102 (FIG. 1) or 502 (FIG. 5). This phase control function is preferably achieved by employing a camera 738, which monitors the far field pattern 728. It is appreciated that the output intensity of the entire system of FIG. 7 can be maximized by adjusting the relative phase of the outputs of the individual optical amplifiers 102 (FIG. 1) or optical amplifiers 502 (FIG. 5). In accordance with a preferred embodiment of the present invention, the output of camera 738 is received by phase control logic circuitry 740, preferably operative in the manner described hereinabove with reference to FIGS. 2 and 3.

Figure 8:
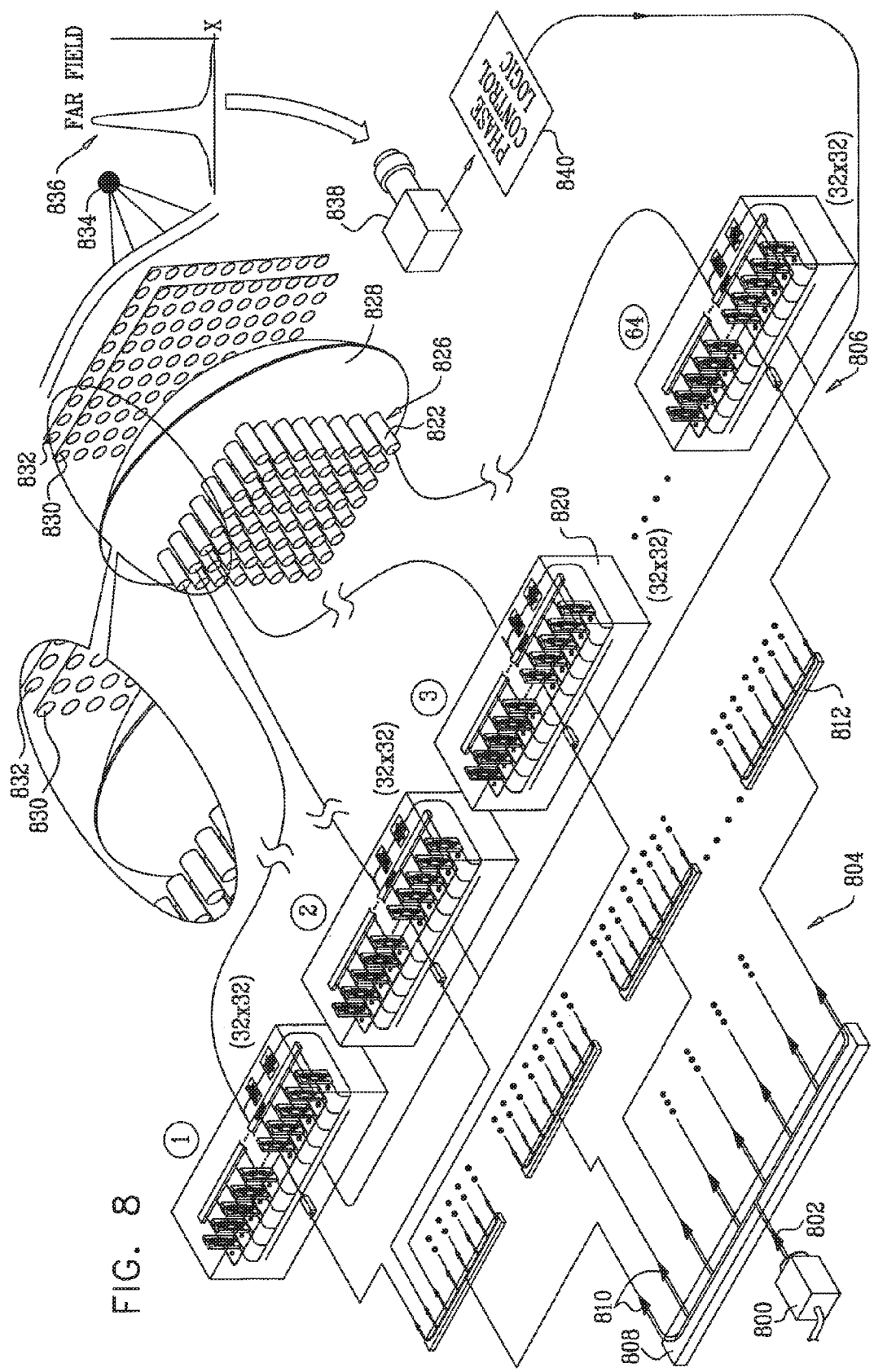
FIG. 8 is a simplified illustration of a laser system constructed and operative in accordance with yet another preferred embodiment of the present invention.

Reference is now made to FIG. 8, which is a simplified illustration of a laser system constructed and operative in accordance with another preferred embodiment of the present invention. FIG. 8 exemplifies an alternative further scale up of the system of either of FIGS. 1 and 5.

As seen in FIG. 8, there is provided a laser system including a seed laser 800, typically a 50 MW laser, such as a LU0976M150-1306E10A commercially available from Lumics Inc. The output of the seed laser 800 is amplified by an optical amplifier 802, preferably a tapered optical amplifier. The output of optical amplifier 802 is preferably coupled via a network 804 of optical fibers to an optical amplification supersystem 806, providing an amplified laser output. Preferably network 804 comprises polarization maintaining single mode fibers, such as PM780-HP fibers available from Thorlabs Inc., which are joined via suitable beam splitters.

In a preferred embodiment of the invention, illustrated in FIG. 8, network 804 employs a 1×8 beam splitter 808, such as a PMC-1×N-3-8-2-2-2-0-0 from Micro Optics Inc., which receives the output of optical amplifier 802 and directs it to eight optical amplifiers 810, arranged in parallel. The outputs of each of the eight optical amplifiers 810 are each directed to a 1×8 beam splitter 812, such as a PMC-1×N-3-8-2-2-2-0-0 from Micro Optics Inc.

In accordance with a preferred embodiment of the present invention, the optical amplification supersystem 806 includes a plurality of amplification systems 820, each of which typically includes all of the apparatus shown in FIG. 1 downstream of the seed laser 100 or all of the apparatus shown in FIG. 5 downstream of the seed laser 500 (FIG. 5). The outputs of combiners 142 (FIG. 1) or combiners 542 (FIG. 5) are supplied via optical fibers 822. Optical fibers 822 are preferably large area mode fibers which can carry light at a kilowatt power level, commercially available from Nufern, 7 Airport Park Road, East Granby, Conn. 06026. The output ends of optical fibers 822 are preferably arranged in a two-dimensional array 826. A lens 828, having a focal length f, is positioned at a distance f from the two dimensional array of optical fibers 826 and receives substantially the entire total light output of all of the optical fibers 822.

It is a particular feature of this embodiment of the present invention that a pair of lens arrays 830 and 832 each including a multiplicity of lenses of focal length g, is positioned at a suitable distance, such as distance f, downstream of the lens 828 and receives substantially the entire total light output of lens 828. The lens arrays 830 and 832 preferably are identical and are aligned and mutually spaced by distance g, which is equal to the focal length of each of the lenses in arrays 830 and 832. Lens arrays 830 and 832 together produce a single beam of light which propagates in free space and, at a suitable propagation distance, produces a far field pattern designated by reference numeral 834. A preferred far field pattern is a beam having an at least nearly Gaussian profile as illustrated in an intensity profile of the far field pattern, designated by reference numeral 836.

The intensity profile of the far field pattern 834 may be governed by controlling the relative phases of amplifiers 102 (FIG. 1) or 502 (FIG. 5). This phase control function is preferably achieved by employing a camera 838, which monitors the far field pattern 834. It is appreciated that the output intensity of the entire system of FIG. 8 can be maximized by adjusting the relative phase of the outputs of the individual optical amplifiers 102 (FIG. 1) or optical amplifiers 502 (FIG. 5). In accordance with a preferred embodiment of the present invention, the output of camera 838 is received by phase control logic circuitry 840, preferably operative in the manner described hereinabove with reference to FIGS. 2 and 3.

Figure 9:
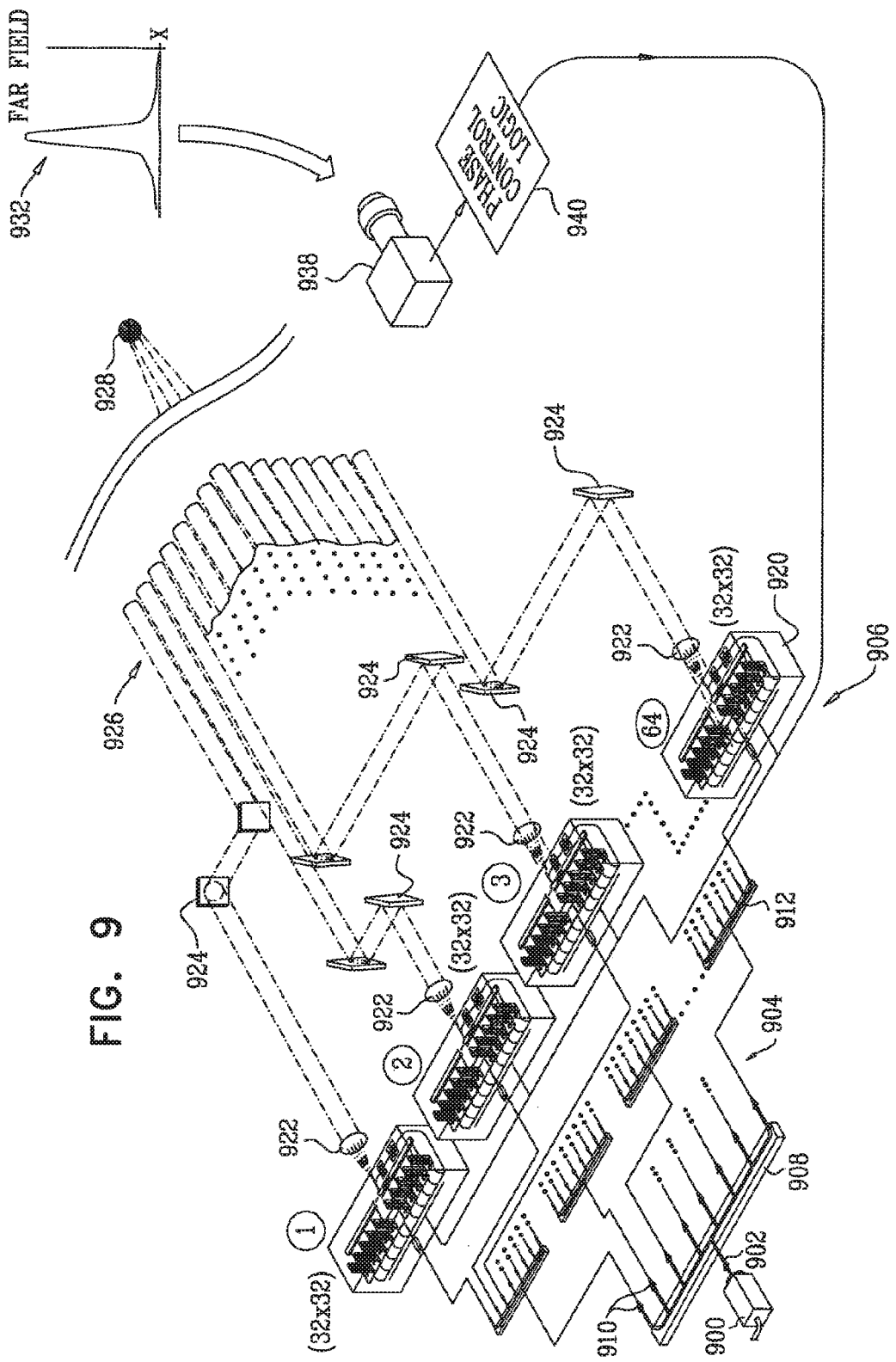
FIG. 9 is a simplified illustration of a laser system constructed and operative in accordance with still another preferred embodiment of the present invention.

Reference is now made to FIG. 9 which is a simplified illustration of a laser system constructed and operative in accordance with another preferred embodiment of the present invention. FIG. 9 exemplifies a further scale up of the system of either of FIGS. 1 and 5.

As seen in FIG. 9, there is provided a laser system including a seed laser 900, typically a 50 MW laser, such as a LU0976M150-1306E10A commercially available from Lumics Inc. The output of the seed laser 900 is amplified by an optical amplifier 902, preferably a tapered optical amplifier. The output of optical amplifier 902 is preferably coupled via a network 904 of optical fibers to an optical amplification supersystem 906, providing an amplified laser output. Preferably network 904 comprises polarization maintaining single mode fibers, such as PM780-HP fibers available from Thorlabs Inc., which are joined via suitable beam splitters.

In a preferred embodiment of the invention, illustrated in FIG. 9, network 904 employs a 1×8 beam splitter 908, such as a PMC-1×N-3-8-2-2-2-0-0 from Micro Optics Inc., which receives the output of optical amplifier 902 and directs it to eight optical amplifiers 910, arranged in parallel. The outputs of each of the eight optical amplifiers 910 are each directed to a 1×8 beam splitter 912, such as a PMC-1×N-3-8-2-2-2-0-0 from Micro Optics Inc.

In accordance with a preferred embodiment of the present invention, the optical amplification supersystem 906 includes a plurality of amplification systems 920, each of which preferably includes all of the apparatus shown in FIG. 1 downstream of the seed laser 100 or all of the apparatus shown in FIG. 5 downstream of the seed laser 500 (FIG. 5). The outputs of combiners 142 (FIG. 1) or combiners 542 (FIG. 5) are supplied via collimating lenses 922 and mirrors 924 to preferably form a two-dimensional array 926. The separate outputs of collimating lenses 922 each propagate and diverge in free space and, at a suitable propagation distance from lenses 922, combine in a far field pattern, designated by reference numeral 928. A spatial intensity diagram of the far field pattern 928 is designated by reference numeral 932. It is seen that a preferred far field pattern has an intensity profile having an at least nearly Gaussian profile, as illustrated in spatial intensity diagram 932.

The intensity profile of the far field pattern 928 may be governed by controlling the relative phases of amplifiers 102 (FIG. 1) or 502 (FIG. 5). This phase control function is preferably achieved by employing a camera 938, which monitors the far field pattern 928. It is appreciated that the output intensity of the entire system of FIG. 9 can be maximized by adjusting the relative phase of the outputs of the individual optical amplifiers 102 (FIG. 1) or optical amplifiers 502 (FIG. 5). In accordance with a preferred embodiment of the present invention, the output of camera 938 is received by phase control logic circuitry 940, preferably operative in the manner described hereinabove with reference to FIGS. 2 and 3.

Figure 10:
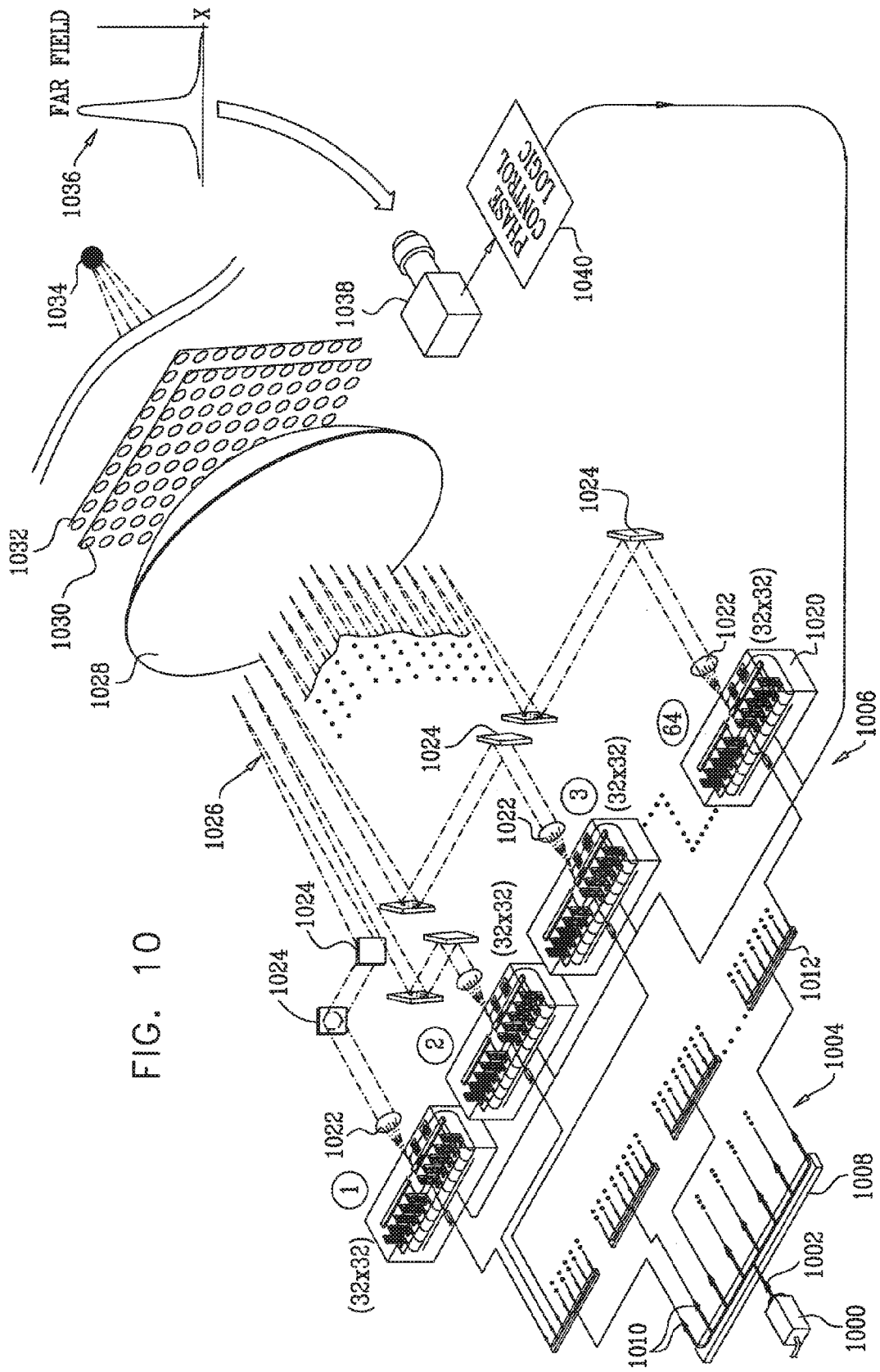
FIG. 10 is a simplified illustration of a laser system constructed and operative in accordance with a further preferred embodiment of the present invention.

Reference is now made to FIG. 10, which is a simplified illustration of a laser system constructed and operative in accordance with another preferred embodiment of the present invention. FIG. 10 exemplifies an alternative further scale up of the system of either of FIGS. 1 and 5.

As seen in FIG. 10, there is provided a laser system including a seed laser 1000, typically a 50 MW laser, such as a LU0976M150-1306E10A commercially available from Lumics Inc. The output of the seed laser 1000 is amplified by an optical amplifier 1002, preferably a tapered optical amplifier. The output of optical amplifier 1002 is preferably coupled via a network 1004 of optical fibers to an optical amplification supersystem 1006, providing an amplified laser output. Preferably network 1004 comprises polarization maintaining single mode fibers, such as PM780-HP fibers available from Thorlabs Inc., which are joined via suitable beam splitters.

In a preferred embodiment of the invention, illustrated in FIG. 10, network 1004 employs a 1×8 beam splitter 1008, such as a PMC-1×N-3-8-2-2-2-0-0 from Micro Optics Inc., which receives the output of optical amplifier 1002 and directs it to eight optical amplifiers 1010, arranged in parallel. The outputs of each of the eight optical amplifiers 1010 are each directed to a 1×8 beam splitter 1012, such as a PMC-1×N-3-8-2-2-2-0-0 from Micro Optics Inc.

In accordance with a preferred embodiment of the present invention, the optical amplification supersystem 1006 includes a plurality of amplification systems 1020, each of which preferably includes all of the apparatus shown in FIG. 1 downstream of the seed laser 100 or all of the apparatus shown in FIG. 5 downstream of the seed laser 500 (FIG. 5). The outputs of combiners 142 (FIG. 1) or combiners 542 (FIG. 5) are imaged via lenses 1022 and mirrors 1024 preferably to form a two-dimensional array 1026. A lens 1028, having a focal length f, is positioned at a distance f from the two dimensional array 1026 and receives substantially the entire total light output of all of the lenses 1022.

It is a particular feature of this embodiment of the present invention that a pair of lens arrays 1030 and 1032 each including a multiplicity of lenses of focal length g, is positioned at a suitable distance, such as distance f, downstream of the lens 1028 and receives substantially the entire total light output of lens 1028. The lens arrays 1030 and 1032 preferably are identical and are aligned and mutually spaced by distance g, which is equal to the focal length of each of the lenses in arrays 1030 and 1032. Lens arrays 1030 and 1032 together produce a single beam of light which propagates in free space and, at a suitable propagation distance, produces a far field pattern designated by reference numeral 1034. A preferred far field pattern is a beam having an at least nearly Gaussian profile, as illustrated in an intensity profile of the far field pattern, designated by reference numeral 1036.

The intensity profile of the far field pattern 1034 may be governed by controlling the relative phases of amplifiers 102 (FIG. 1) or 502 (FIG. 5). This phase control function is preferably achieved by employing a camera 1038, which monitors the far field pattern 1034. It is appreciated that the output intensity of the entire system of FIG. 10 can be maximized by adjusting the relative phase of the outputs of the individual optical amplifiers 102 (FIG. 1) or optical amplifiers 502 (FIG. 5). In accordance with a preferred embodiment of the present invention, the output of camera 1038 is received by phase control logic circuitry 1040, preferably operative in the manner described hereinabove with reference to FIGS. 2 and 3.

It is appreciated by persons skilled in the art that the present invention is not limited by what has been particularly shown and described hereinabove. Rather the scope of the present invention includes both combinations and subcombinations of various features described hereinabove as well as variations and modifications thereto which would occur to a person of skill in the art upon reading the above description and which are not in the prior art.

The invention claimed is:

1. A laser system comprising:
   a seed laser; and
   an optical amplification subsystem, receiving an output of said seed laser and providing an amplified laser output, said optical amplification subsystem comprising:
   a first plurality of more than two amplifier assemblies, each of said first plurality of more than two amplifier assemblies including a second plurality of more than two optical amplifiers arranged in parallel; and
   first phase control circuitry including phase modulating functionality associated with each of said first plurality of more than two amplifier assemblies,
   each of said first plurality of more than two amplifier assemblies also comprising second phase control circuitry operative to maximize the total output intensity of said second plurality of more than two optical amplifiers.

2. A laser system according to claim 1 and wherein said second phase control circuitry comprises phase modulating functionality associated with each of said second plurality of more than two optical amplifiers, said second phase control circuitry including a total output intensity sensor which measures the total output intensity of said second plurality of more than two optical amplifiers and phase control logic circuitry which receives an output from said total output intensity sensor and varies the phase relationships of individual ones of said second plurality of more than two optical amplifiers in order to maximize the total output intensity of said second plurality of more than two optical amplifiers as sensed by said total output intensity sensor.

3. A laser system according to claim 2 and wherein said phase control logic circuitry ascertains the current supplied to each of said second plurality of more than two optical amplifiers which produces the maximum total output intensity of said laser system.

4. A laser system according to claim 2 and wherein said phase control logic circuitry sequentially varies the current supplied to each of said second plurality of more than two optical amplifiers and selects the current supplied to each of said second plurality of more than two optical amplifiers to be the current which produces the maximum total output intensity of said laser system.

5. A laser system according to claim 2 and wherein said second phase control circuitry sequentially varies the phase of each of said second plurality of more than two optical amplifiers and selects the phase of each of said second plurality of more than two optical amplifiers to be the phase which produces the maximum total output intensity of said laser system.

6. A laser system according to claim 5 and wherein multiple different ones of said second plurality of more than two optical amplifiers are simultaneously supplied with different currents.

7. A laser system according to claim 1 and wherein said first phase control circuitry operates independently of said second phase control circuitry.

8. A laser system according to claim 1 and wherein said second phase control circuitry of each one of said first plurality of more than two amplifier assemblies operates independently of said second phase control circuitry of each other of said first plurality of more than two amplifier assemblies.

9. A laser system according to claim 1 and also comprising a coherent free-space far field combiner receiving outputs from at least one of said first plurality of more than two amplifier assemblies and said second plurality of more than two optical amplifiers and directing said outputs from free-space into a single mode optical fiber.

10. A laser system according to claim 1 and also comprising a coherent free-space far field combiner receiving outputs having a first numerical aperture from at least one of said first plurality of more than two amplifier assemblies and said second plurality of more than two optical amplifiers and directing said outputs from free-space into an optical fiber having a second numerical aperture similar to said first numerical aperture.

11. A laser system according to claim 1 and also comprising a coherent free-space far field combiner receiving outputs from at least one of said first plurality of more than two amplifier assemblies and said second plurality of more than two optical amplifiers and coherently combining said outputs from free-space into a single beam having an at least nearly Gaussian profile.

12. A laser system according to claim 11 and wherein brightness of said single beam is substantially higher than the brightness of a corresponding non-coherently combined beam.

13. A laser system comprising:
a seed laser; and
an optical amplification subsystem, receiving an output of said seed laser and providing an amplified laser output, said optical amplification subsystem comprising:
a plurality of optical amplifiers; and
phase control circuitry sequentially varying the phase of each of said plurality of optical amplifiers and selecting the phase of each of said plurality of optical amplifiers to be the phase which produces the maximum total output intensity of said laser system.

14. A laser system according to claim 13 and also comprising a coherent free-space far field combiner receiving outputs from said plurality of optical amplifiers and directing said outputs from free-space into a single mode optical fiber.

15. A laser system according to claim 13 and also comprising a coherent free-space far field combiner receiving outputs having a first numerical aperture from said plurality of optical amplifiers and directing said outputs from free-space into an optical fiber having a second numerical aperture similar to said first numerical aperture.

16. A laser system according to claim 13 and also comprising a coherent free-space far field combiner receiving outputs from said plurality of optical amplifiers and coherently combining said outputs from free-space into a single beam having an at least nearly Gaussian profile.

17. A laser system according to claim 16 and wherein brightness of said single beam is substantially higher than the brightness of a corresponding non-coherently combined beam.

18. A method of independently controlling the phase and output intensity of an optical amplifier including first and second electrodes, the method including:
changing said phase of said optical amplifier independently of said output intensity of said optical amplifier by varying current supplied via said first and second electrodes in a first manner; and
changing said output intensity of said optical amplifier independently of said phase of said optical amplifier by varying current supplied via said first and second electrodes in a second manner, different from said first manner.

19. A method of independently controlling the phase and output intensity of an optical amplifier according to claim 18 and wherein varying current supplied via said first and second electrodes in said first manner includes increasing the current supplied to said first electrode and decreasing the current supplied to the second electrode, such that the output intensity of said optical amplifier is unchanged.

20. A method of independently controlling the phase and output intensity of an optical amplifier according to claim 18 and wherein varying current supplied via said first and second electrodes in said second manner includes changing the current supplied to said first and second electrodes by different amounts such that the phase of said optical amplifier is unchanged.

* * * * *